(12) United States Patent
Gupta et al.

(10) Patent No.: US 7,992,121 B2
(45) Date of Patent: Aug. 2, 2011

(54) SYSTEM AND METHOD FOR I/O SYNTHESIS AND FOR ASSIGNING I/O TO PROGRAMMABLE DEVICES

(75) Inventors: Nagesh Chandrasekaran Gupta, Cupertino, CA (US); Ravi Srinivasa Vedula, Uma Nagar (IN)

(73) Assignee: Cadence Design Systems, Inc., San Jose, CA (US)

( * ) Notice: Subject to any disclaimer, the term of this patent is extended or adjusted under 35 U.S.C. 154(b) by 378 days.

(21) Appl. No.: 12/351,584

(22) Filed: Jan. 9, 2009

(65) Prior Publication Data

US 2009/0178017 A1    Jul. 9, 2009

Related U.S. Application Data

(63) Continuation-in-part of application No. 12/101,068, filed on Apr. 10, 2008, now Pat. No. 7,562,331, which is a continuation of application No. 11/242,151, filed on Sep. 30, 2005, now Pat. No. 7,398,500.

(60) Provisional application No. 61/020,093, filed on Jan. 9, 2008, provisional application No. 61/020,297, filed on Jan. 10, 2008.

(51) Int. Cl.
*G06F 17/50* (2006.01)
(52) U.S. Cl. ........ 716/128; 716/116; 716/117; 716/121; 716/137
(58) Field of Classification Search .......... 716/116–117, 716/121, 128, 137
See application file for complete search history.

(56) References Cited

U.S. PATENT DOCUMENTS

| | | | |
|---|---|---|---|
| 5,140,526 A * | 8/1992 | McDermith et al. | 705/28 |
| 5,414,638 A | 5/1995 | Verheyen et al. | |
| 5,448,496 A * | 9/1995 | Butts et al. | 716/116 |
| 5,475,830 A * | 12/1995 | Chen et al. | 716/108 |
| 5,877,942 A | 3/1999 | Kida et al. | |
| 6,218,858 B1 * | 4/2001 | Menon et al. | 326/39 |
| 6,530,069 B2 | 3/2003 | Jennion et al. | |
| 6,598,216 B2 * | 7/2003 | Chan et al. | 716/115 |
| 7,206,967 B1 * | 4/2007 | Marti et al. | 714/25 |
| 7,299,439 B1 * | 11/2007 | Slonim et al. | 716/116 |
| 7,299,444 B1 | 11/2007 | Tai et al. | |
| 7,313,775 B2 * | 12/2007 | Casey et al. | 716/117 |
| 7,440,866 B2 * | 10/2008 | Maher et al. | 702/120 |
| 7,543,261 B2 * | 6/2009 | Lindberg et al. | 716/119 |
| 2002/0004931 A1 | 1/2002 | Stralen | |
| 2006/0090152 A1 | 4/2006 | Lin et al. | |

* cited by examiner

Primary Examiner — Naum Levin
(74) Attorney, Agent, or Firm — Sawyer Law Group, P.C.

(57) ABSTRACT

A method for connecting a programmable device (PD) and an electronic component (EC) based on a protocol, including: obtaining a signal group of the protocol having a group constraint, a first pin definition including an electrical constraint and a logical constraint, and a second pin definition; mapping the first pin definition to a first pin of the PD based on the electrical constraint, the logical constraint, and the group constraint; identifying a first pin of the EC to connect with the first pin of the PD based on the electrical constraint, the logical constraint, the group constraint, and a connection preference; generating a first connection between the first pin of the EC and a second pin of the PD based on the electrical constraint, the logical constraint, the group constraint, and the connection preference; and storing the first connection in an edge list.

20 Claims, 15 Drawing Sheets

Protocol Synthesis User Interface — 800

| Pin Name | Pin Type | Pin Voltage | IO Standard | Pin Termination | Pin Property | Pin Use Type | Diff. |
|---|---|---|---|---|---|---|---|
| interface_part_name=Virtual | | | | | | | |
| group group_containt=same_bank group_contiguous_pins=Data group_name=Data_Byte1 group_number=1 | | | | | | | |
| CLK0_N | InOut | 1.5 | DIFF_HSTL_II | | | Negative | CLK0_P |
| CLK0_P | InOut | 1.5 | DIFF_HSTL_II | | | Positive | CLK0_N |
| Data[0] | InOut | 1.5 | HSTL_II | | | | |
| Data[1] | InOut | 1.5 | HSTL_II | | | | |
| Data[2] | InOut | 1.5 | HSTL_II | | | | |
| Data[3] | InOut | 1.5 | HSTL_II | | | | |
| Data[4] | InOut | 1.5 | HSTL_II | | | | |
| Data[5] | InOut | 1.5 | HSTL_II | | | | |
| Data[6] | InOut | 1.5 | HSTL_II | | | | |
| Data[7] | InOut | 1.5 | HSTL_II | | | | |

Local Constraints 805
Electrical Constraints 810
Logical Constraints 815
Pin Definition 820
Group Constraint 821
Signal Group 805

*FIGURE 8*

SYSTEM AND METHOD FOR I/O SYNTHESIS AND FOR ASSIGNING I/O TO PROGRAMMABLE DEVICES

CROSS-REFERENCE TO RELATED APPLICATIONS

This application is a continuation-in-part of U.S. patent application Ser. No. 12/101,068, filed on Apr. 10, 2008. Accordingly, this application claims benefit of U.S. patent application Ser. No. 12/101,068 under 35 U.S.C. §120.

U.S. patent application Ser. No. 12/101,068 is a continuation of U.S. patent application Ser. No. 11/242,151, filed on Sep. 30, 2005. Accordingly, U.S. patent application Ser. No. 12/101,068 claims benefit of U.S. patent application Ser. No. 11/242,151 under 35 U.S.C. §120.

This application claims priority to U.S. Provisional Patent Application Ser. No. 61/020,093 under 35 U.S.C. §119(e). U.S. Provisional Patent Application Ser. No. 61/020,093 was filed on Jan. 9, 2008.

This application claims priority to U.S. Provisional Patent Application Ser. No. 61/020,297 under 35 U.S.C. §119(e). U.S. Provisional Patent Application Ser. No. 61/020,297 was filed on Jan. 10, 2008.

All mentioned U.S. patent applications and U.S. Provisional patent applications are hereby incorporated by reference in their entirety.

BACKGROUND

A printed circuit (PC) board provides a surface to mount and interconnect electronic components. In general, a PC board consists of an insulating sheet onto which conductive paths are printed. The insulating sheet, also referred to as the substrate, is often composed of fiberglass-reinforced epoxy composite. The printed conductive paths, also referred to as traces, are often composed of copper. After the PC board has been manufactured, electronic components are mounted on the substrate and attached to the traces usually by soldering. As PC boards are rugged, inexpensive, and highly reliable, they are used extensively in many types of electronic equipment and systems.

There are many different types of electronic components that can be mounted and interconnected using a PC board. Examples of such electronic components include memory chips, transistors, resistors, processor chips, and programmable devices such as a field programmable gate array (FPGA). A pin often serves as a connection point to an electronic component. In other words, when connecting two electronic components together, it is a pin of the first electronic component that is being connected (e.g., via a copper trace) to a pin of the second electronic component. An electronic component may have any number of pins. Some electronic components have fewer than a dozen pins, while other electronic components, an FPGA for example, may have over 1,000 pins.

As a PC board may have many electronic components, and as each of the electronic components may have many pins, it is desirable to have a system and method for connecting the electronic components in accordance with at least the electrical constraints and logical constraints of the pins.

SUMMARY

In general, in one aspect, the invention relates to a method for connecting a programmable device (PD) and an electronic component (EC) based on a protocol. The method comprises: obtaining a signal group of the protocol comprising a group constraint, a first pin definition including an electrical constraint and a logical constraint, and a second pin definition; mapping the first pin definition to a first pin of the PD based on the electrical constraint, the logical constraint, and the group constraint, wherein the first pin of the PD is programmable to operate in accordance with the logical constraint and the electrical constraint; identifying a first pin of the EC to connect with the first pin of the PD based on the electrical constraint, the logical constraint, the group constraint, and a connection preference; generating a first connection between the first pin of the EC and a second pin of the PD based on the electrical constraint, the logical constraint, the group constraint, and the connection preference, wherein the second pin of the PD is programmable to operate in accordance with the logical constraint and the electrical constraint; and storing the first connection in an edge list.

In general, in one aspect, the invention relates to a computer readable medium storing instructions for connecting a first programmable device (PD) and an electronic component (EC) based on a protocol. The instructions comprise functionality to: obtain a signal group of the protocol comprising a group constraint, a first pin definition including an electrical constraint and a logical constraint, and a second pin definition; map the first pin definition to a first pin of the PD based on the electrical constraint, the logical constraint, and the group constraint, wherein the first pin of the PD is programmable to operate in accordance with the logical constraint and the electrical constraint; identify a first pin of the EC to connect with the first pin of the PD based on the electrical constraint, the logical constraint, the group constraint, and a connection preference; generate a first connection between the first pin of the EC and a second pin of the PD based on the electrical constraint, the logical constraint, the group constraint, and the connection preference, wherein the second pin of the PD is programmable to operate in accordance with the logical constraint and the electrical constraint; and store the first connection in an edge list.

In general, in one aspect, the invention relates to a system for connecting a first programmable device (PD) and an EC based on a protocol. The system comprises: a component repository storing a component file describing the PD; a protocol synthesizer comprising an edge weight matrix (EWM) for mapping a signal group of the protocol to a first pin group of the PD using the component file, wherein the signal group comprises a group constraint, a pin definition including an electrical constraint and a logical constraint; a canvas for settings positions of the PD and the EC; and an edgelist generator comprising a pin group locking matrix for identifying a pin group of the EC to connect with the first pin group of the PD after mapping the signal group and setting positions, wherein the edgelist generator is further configured to generate a plurality of connections between the pin group of the EC and a second pin group of the PD based on the group constraint, the electrical constraint, the logical constraint, and a connection preference.

BRIEF DESCRIPTION OF DRAWINGS

FIG. 8-14 show examples in accordance with one or more embodiments of the invention.

DETAILED DESCRIPTION

Figure 1:
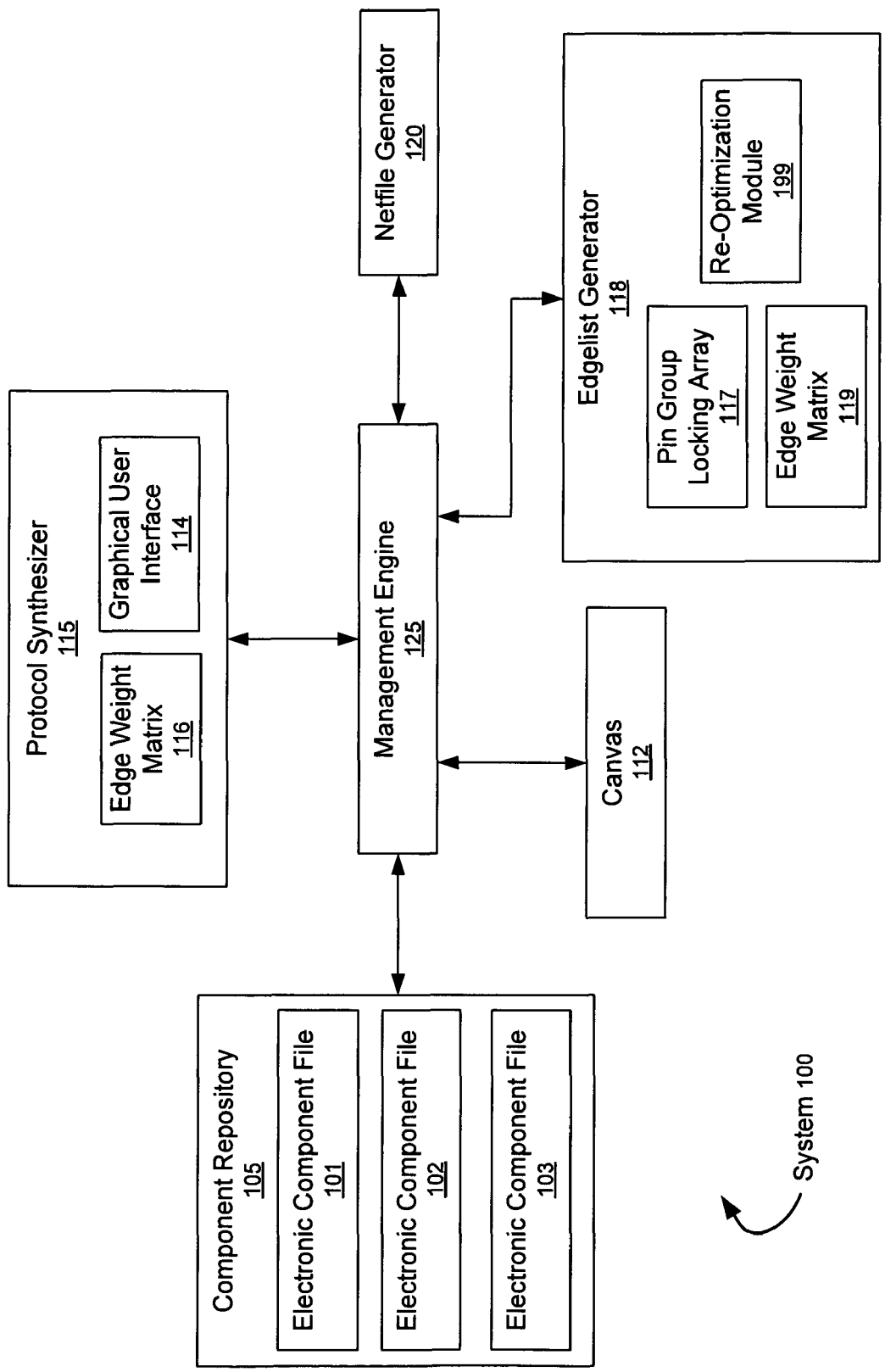
FIG. 1 shows a system in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention provide a system and method to connect multiple programmable devices based on a protocol. The protocol defines multiple signals by specifying the electrical constraints and the logical constraints of the signals. The protocol may further partition the multiple signals into signal groups subject to group constraints. Connecting the multiple programmable devices based on the protocol includes identifying pins of the programmable devices that can be programmed to operate in accordance with the electrical constraints, the logical constraints, and/or the group constraints specified by the protocol. Further, connecting the multiple programmable devices includes generating connections according to one or more connection preferences (e.g., a length matching preference, a smallest fit preference, a nearest fit preference, a least displacement preference, etc.).

In one or more embodiments of the invention, a protocol is a set of formal rules describing how to transmit data between two or more electronic components including, for example, the format, timing, sequencing, and/or error checking of the data transmissions. Accordingly, a protocol includes multiple signals defined by electrical constraints and logical constraints (discussed below). Further, the protocol may partition the multiple signals into one or more signal groups subject to additional group constraints. As a protocol signal may be realized (i.e., generated and/or received) by a pin of an electronic device, the signal and its definition may be referred to as a pin definition.

In one or more embodiments of the invention, the pins of an electronic component are also defined by electrical constraints and logical constraints. The electrical constraints and the logical constraints of each pin may be set when the electronic component is being manufactured (e.g., a memory chip, a processor). However, for some electronic components known as programmable devices (e.g., a field programmable gate array (FPGA), a socket of a backplane, etc.), the electrical constraints and/or logical constraints of a pin may be programmed and reprogrammed (e.g., by an end user) after the electronic component is manufactured.

Further, the pins of a programmable device are often partitioned into pin groups (e.g., banks in the case of an FPGA, same clock regions, same data stobe signal (DQS) groups) of one or more sizes. Instead of individually programming the pins of a pin group, the electrical constraints and/or logical constraints may be programmed for the pin group as a whole. In other words, all pins in a pin group may be programmed to adhere to the same electrical constraints and the same logical constraints. In addition to programmable pins, a programmable device may include programmable logic (i.e., programmable by the user) to process signals received by the pins and then transmit the results using the same or other pins.

The electrical constraints of a pin/signal may define voltage ranges, current ranges, frequency ranges, rise times, fall times and other electrical properties of the pin/signal. Accordingly, in order for a pin to realize a signal, the electrical constraints of the pin must be compatible, i.e., match with, the electrical constraints of the signal. For example, a signal may be defined as having a minimal voltage of 10V. Accordingly, a pin that can be programmed to transmit or receive at least 10V may be used to realize the signal. However, a pin that cannot be programmed to transmit or receive at least 10V cannot be used to realize the signal. These same electrical constraints may also be used when forming and/or prohibiting connections between two pins of different electronic components. For example, a pin transmitting a signal having a frequency of 500 MHz cannot be connected with a pin restricted to a frequency of 100 MHz or less.

The logical constraints of a pin/signal may define the function or type of the pin/signal. For example, the pin/signal may be a bidirectional data pin/signal, an address pin/signal, a clock pin/signal, a data strobe (DQS), a power pin/signal, a ground reference, a positive pin/signal of a differential pair, a negative pin/signal of a differential pair, etc. Accordingly, in order for a pin to realize a signal, the logical constraints of the pin must be compatible, i.e., match with, the logical constraints of the signal. For example, a signal may be defined as a clock signal. Accordingly, a pin that can be programmed to transmit or receive a clock signal may be used to realize the signal. However, a pin that cannot be programmed to transmit or receive a clock signal cannot be used to realize the signal. These same logical constraints may also be used when forming and/or prohibiting connections between two pins of different electronic components. For example, a pin transmitting a bidirectional signal cannot be connected with a unidirectional pin.

Those skilled in the art, having the benefit of this detailed description, will appreciate that an electronic standard (e.g., High Speed Transceiver Logic (HSTL)) specifies multiple electrical constraints and/or logical constraints. Accordingly, by tying a pin/signal to the electrical standard, i.e., specifying the pin/signal adheres to the electronic standard, the electrical constraints and/or logical constraints of the pin/signal are inherently known.

As discussed above, when connecting two or more electronic components, the corresponding pins of the electronic components must have or be programmed to have compatible electrical constraints and logical constraints. In addition to the compatible electrical constraints and logical constraints, a protocol or user may specify additional requirements, (i.e., connection preferences) needed to form an acceptable connection. The additional requirements may be specified at the pin or pin group level.

For example, a protocol or user may specify that all connections between two pin groups must be similar in length (i.e., a length matching preference). Alternatively, a protocol or user may specify that all or almost all pins of a pin group must be used when generating connections to said pin group (i.e., a smallest fit preference). As yet another example, a protocol or user may specify that a set of connections between two electronic components must use pin groups that are close in proximity (i.e., a nearest fit preference). Further still, a protocol or user may specify that a set of connections between two electronic components must use pin groups that are similar in horizontal or vertical alignment (i.e., a least displacement preference). Those skilled in the art, having the benefit of this detailed description, will appreciate that many other types of connection preferences exist. Further, those skilled in the art, having the benefit of this detailed description, will also appreciate that multiple connection preferences can each be assigned a priority, e.g., a weighting factor, and then combined to generate an overall connection preference.

In one or more embodiments of the invention, a distance measurement (e.g., calculated for a connection preference) involving a pin may be taken from a location of the pin on the package of the electronic component, from a location on the die of the electronic component corresponding to the pin, and/or from a location in the breakout associated with the electronic component on the PC board corresponding to the pin. These location options for starting/terminating distance measurements may be set by the protocol and/or the end user.

FIG. 1 shows a system in accordance with one or more embodiments of the invention. As shown in FIG. 1, the system has multiple components including a component repository (105), a canvas (112), a protocol synthesizer (115), an edgelist generator (118), a netfile generator (120), and a management engine (125). Each of these components are described below and may be located on the same device (e.g., a server, mainframe, desktop personal computer (PC), laptop, personal digital assistant (PDA), television, cable box, satellite box, kiosk, telephone, mobile phone, etc.) or may be located on separate devices connected by a network (e.g., the Internet), with wired and/or wireless segments.

In one or more embodiments of the invention, the component repository (105) stores one or more electronic component files (101, 102, 103), each describing an electronic component. An electronic component file may include both a visual representation (e.g., symbol) of an electronic component and pin/package information (e.g., package dimensions, pin locations on the package, pin locations on the die, pin sizes, pin labels, etc.) for the electronic component. An electronic component file may also include the electrical constraints and/or logical constraints of the electronic component's pins. The electronic component file (101, 102, 103) may explicitly list said constraints and/or indirectly list said constraints by indicating that one or more pins adhere to a known electrical standard.

In one or more embodiments of the invention, when the electronic component file (101, 102, 103) is associated with a programmable device (e.g., an FPGA), the electronic component file (101, 102, 103) specifies both the pin groups of the programmable device (e.g., banks of the FPGA) and the programming ranges of the pins within each pin group. In other words, the electronic component file (101, 102, 103) stores multiple electrical constraints and/or logical constraints, and one or more pins of the programmable device are programmable to operate in accordance with the stored electrical constraints and/or logical constraints. In one or more embodiments of the invention, an electrical constraint, set by the user, specified in the electronic standard, and/or specified in the electronic component file, limits the number of usable input/outputs (I/O) in a pin group of a programmable device (e.g., bank utilization factor).

In one or more embodiments of the invention, the component repository (105) is a database, a flat file, or any type of data store. Each electronic component file (101, 102, 103) may be of any format (e.g., extensible markup language (XML), a spreadsheet format, a text document format, etc.). Further, new electronic component files (e.g., downloaded from the manufacturer of an electronic component) may be added to the component repository (105) while existing electronic component files may be modified and/or deleted.

In one or more embodiments of the invention, the canvas (112) represents one or more PC boards, including traces, to be manufactured. Scaled images of one or more electronic components, including pins of the one or more electronic components, may be placed and rotated within the perimeter of the canvas (112). The canvas (112) may include gridlines for use in positioning the electronic components on the one or more PC boards. Further, the gridlines may be of sufficient granularity to ensure that all pins of every electronic component represented on the canvas (112) can be uniquely identified by a row number and a column number. In one or more embodiments of the invention, the scaled image of an electronic component is obtained from the component repository (105) (discussed above).

In one or more embodiments of the invention, the protocol synthesizer (115) is used to both create new protocols and map the pin definitions (i.e., signals) of new/existing protocols to the pins of one or more programmable devices. As shown in FIG. 1, the protocol synthesizer (115) includes a graphical user interface (GUI) (114) for specifying the signals, electrical constraints, logical constraints, signal groups, and/or group constraints of a new protocol during protocol synthesis. Further, the protocol synthesizer (115) also includes an edge weight matrix (EWM) (116) for identifying pins of a programmable device that can realize one or more signals of a new/existing protocol, and for mapping the signals to chosen pins. Any mappings extracted from the EWM (116) may be stored for future use.

Figure 2:
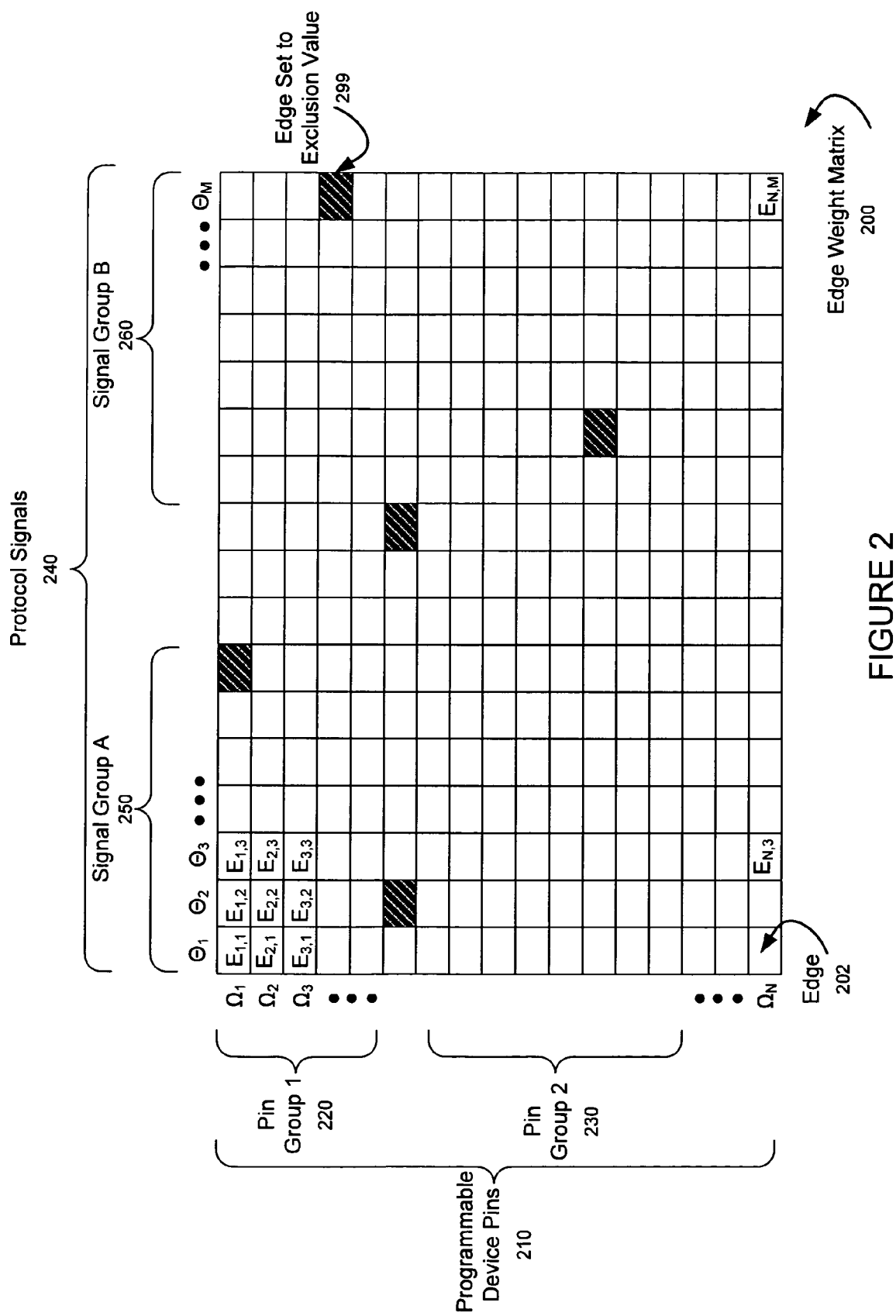
FIG. 2 shows an edge weight matrix (EWM) in accordance with one or more embodiments of the invention.

FIG. 2 shows an EWM (200) in accordance with one or more embodiments of the invention. The EWM (200) shown in FIG. 2 may be essentially the same as EWM (116). As shown in FIG. 2, the columns (240) of the EWM (200) represent the signals of a protocol (i.e., $\Theta_1, \Theta_2, \ldots, \Theta_M$) and the signal groups (i.e., Signal Group A (250), Signal Group B (260)) of the protocol. As also shown in FIG. 2, the rows (210) of the EWM (200) represent the pins of a programmable device (i.e., $\Omega_1, \Omega_1, \ldots, \Omega_N$) and the pin groups (i.e., Pin Group 1 (220), Pin Group 2 (230)) of the programmable device. In one or more embodiments of the invention, the power pins, ground pins, and/or configure pins of a programmable device are not included in the EWM (200).

In one or more embodiments of the invention, the intersection of a row and a column in the EWM (200) represents the mapping of the signal associated with said column to the pin associated with said row. For example, Edge (202) represents the mapping of signal $\Theta_1$ to pin $\Omega_N$. Further, each entry in the EWM has a value (i.e., $E_{1,1}, E_{1,2}, \ldots, E_{N,M}$) corresponding to the desirability of the related mapping. For example, the value $E_{1,2}$ corresponds to the desirability of mapping signal $\Theta_2$ to pin $\Omega_1$.

In one or more embodiments of the invention, the edge in the EWM (200) with the smallest value is chosen for each signal (i.e., $\Theta_1, \Theta_2, \ldots, \Theta_M$). The pin corresponding to the chosen edge is deemed to be the best choice for realizing the signal. For example, for signal $\Theta_3$, the edge having a value equal to $\min\{E_{1,3}, E_{2,3}, E_{3,3}, \ldots, E_{N,3}\}$ is chosen. Assuming $E_{3,3}=\min\{E_{1,1}, E_{2,3}, E_{3,3}, \ldots, E_{N,3}\}$, pin $\Omega_3$ is deemed to be the best choice for realizing signal $\Theta_3$. In one or more embodiments of the invention, the edge with the greatest value is chosen for each signal (i.e., $\Theta_1, \Theta_2, \ldots, \Theta_M$).

In one or more embodiments of the invention, the values in the EWM (200) range between the lower limit and the upper limit of the short integer range. Accordingly, an edge value equal to the upper limit represents the least desirable edge, while an edge value equal to the lower limit represents the most desirable edge.

In one or more embodiments of the invention, when a pin is unable to realize a signal (e.g., the electrical constraints and the logical constraints of the pin are not compatible with the electrical constraints and the logical constraints of the signal), the corresponding edge is set to an exclusion value (299). The exclusion value is a sufficiently high value (e.g., upper limit of the short integer range) such that said corresponding edge will not be chosen by a minimum expression (i.e., min{A, B, C, D}). In one or more embodiments of the invention, once a pin is chosen to realize a signal, all other entries in the same row or column as the chosen edge are set to the exclusion value (299).

Referring back to FIG. 1, in one or more embodiments of the invention, the edgelist generator (118) is configured to both identify compatible pins belonging to different programmable devices and generate connections between the multiple programmable devices. In other words, the edgelist generator (118) is configured to generate a pin out for one or more electronic devices on the canvas (112). The generated connections may be added to an edge list (not shown) and stored for future use.

As shown in FIG. 1, the edgelist generator (118), like the protocol synthesizer, includes an EWM (119). The columns and rows of the EWM (119) represent the pins and pin groups of two electronic components (e.g., two programmable devices, one programmable device and one non-programmable device). In one or more embodiments of the invention, the intersection (i.e., edge) of a row and a column in the EWM (119) represents a connection between the pin associated with said row and the pin associated with said column. The value of the edge represents the desirability of the connection represented by the entry. In one or more embodiments of the invention, the range of values in the EWM (119) may be essentially the same as the range of values populating the EWM (116). Similarly, the EWM (119), like the EWM (116), may use exclusion values to indicate two pins that are incompatible (i.e., the two pins do not have compatible electrical constraints and/or logical constraints).

As also shown in FIG. 1, the edgelist generator (118) includes a pin group locking array (PGLA) (117) for locking pin groups from different programmable devices based on one or more connection preferences (e.g., a length matching preference, a smallest fit preference, a nearest fit preference, a least displacement preference, etc.). In one or more embodiments of the invention, when two pin groups are locked, the remaining unconnected pins in one of the pin groups are connected to the remaining unconnected pins in the other pin group.

Figure 3:
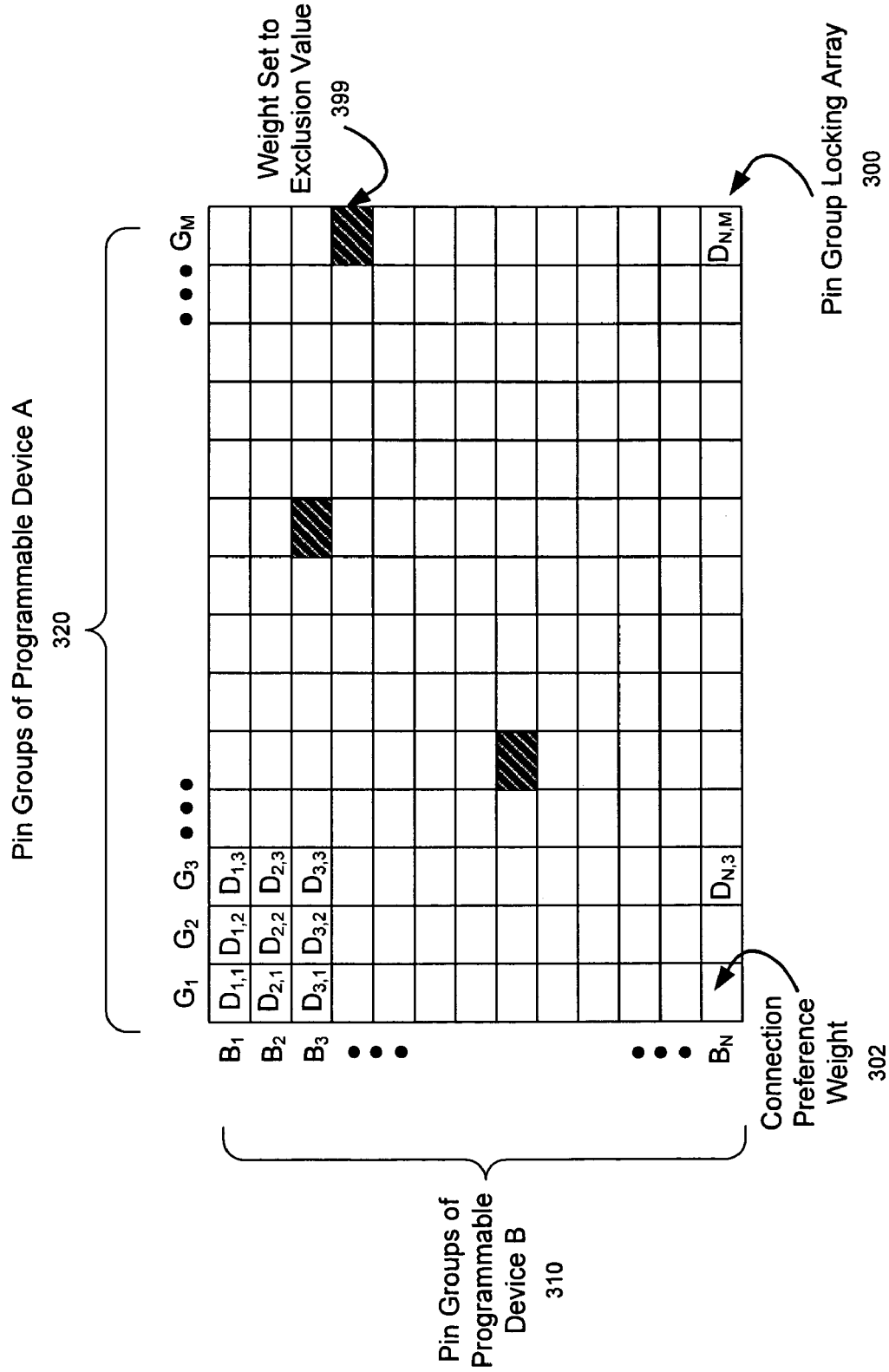
FIG. 3 shows a pin group locking array (PGLA) in accordance with one or more embodiments of the invention.

FIG. 3 shows a pin group locking array (PGLA) (300) in accordance with one or more embodiments of the invention. The PGLA (300) shown in FIG. 3 may be essentially the same as PGLA (117). As shown in FIG. 3, the columns (320) of the PGLA (300) represent the pin groups of a programmable device (i.e., $G_1, G_2, \ldots, G_M$). The rows (310) of the PGLA (300) represent the pin groups of another programmable device (i.e., $G_1, G_2, \ldots, G_M$).

In one or more embodiments of the invention, the intersection of a row and a column in the PGLA (300) represents the locking of a pin group associated with said row and a pin group associated with said column. For example, Connection Preference Weight (302) represents the locking of pin group $G_1$ with pin group $B_N$. Further, each entry in the PGLA (300) has a value (i.e., $D_1, D_{1,2}, \ldots, D_{N,M}$) corresponding to the desirability of locking the corresponding pin groups. For example, the value $D_{1,2}$ corresponds to the desirability of locking pin group $G_2$ and pin group $B_1$.

In one or more embodiments of the invention, the edge in the PGLA (300) with the smallest value is chosen for each pin group (e.g., $G_1, G_2, \ldots, G_M$). The pin group (e.g., $B_1, B_2, \ldots, B_N$) corresponding to the chosen edge is deemed to be the best choice for locking. For example, for signal $G_3$, the edge having a value equal to $\min\{D_{1,3}, D_{2,3}, D_{3,3}, \ldots, D_{N,3}\}$ is chosen. Assuming $D_{3,3}=\min\{D_{1,3}, D_{2,3}, D_{3,3}, \ldots, D_{N,3}\}$, pin group $B_3$ is deemed to be the best choice for locking with pin group $G_3$. In one or more embodiments of the invention, the edge with the greatest value is chosen for each pin group (i.e., $G_1, G_2, \ldots, G_M$).

In one or more embodiments of the invention, if the connection preference is a length matching preference, each value in PGLA (300) represents an absolute difference between the longest connection length (e.g., Manhattan distance) and the shortest connection length between corresponding pin groups. Similarly, if the connection preference is a smallest fit preference, each value in the PGLA (300) represents an absolute difference between the sizes (i.e., number of pins) of the corresponding pin groups. Further, if the connection preference is a nearest fit preference, each value in the PGLA (300) represents the average distance (e.g., Manhattan distance) between the corresponding pin groups.

Further still, if the connection preference is a least displacement factor, each entry in the PGLA (300) represents the horizontal alignment and/or vertical alignment offset between the corresponding pin groups.

Those skilled in the art, having the benefit of this detailed description, will appreciate that multiple connection preferences can each be assigned a priority (e.g., a weighting factor) and then combined to generate an overall connection preference. Accordingly, in such embodiments, each value in PGLA (300) corresponds to an overall connection preference.

In one or more embodiments of the invention, if two pin groups are not compatible (e.g., one pin group requires more connections than the other pin group can provide, the electrical constraints and the logical constraints of the pins in one pin group are not compatible with the electrical constraints and/or the logical constraints of the pins in the other pin group), the connection preference weight corresponding to the two pin groups is set to an exclusion value (399). In one or more embodiments of the invention, once two pin groups are selected for locking, all other entries in the corresponding row and column of the chosen entry are set to the exclusion value (399).

Referring back to FIG. 1, the edgelist generator (118) further includes a re-optimization module (199). In one or more embodiments of the invention, the re-optimization module (199) is configured to execute a feedback process for existing connections. The feedback process may include marking pins in the pin out corresponding to the existing connections that are not optimal for routing/layout, identifying the layers (of the PC board) corresponding to the pins, identifying the pin breakout on the PC board, and then applying one or more algorithms (discussed below) to generate new connections for the marked pins.

These new connections should reduce the number of required layers to connect the multiple electronic devices on the canvas (112).

In one or more embodiments of the invention, the netfile generator (120) is configured to obtain an edgelist and generate a netfile for the connections between the electronic components stored in the edgelist. Those skilled in the art, having the benefit of this detailed description, will appreciate that the netfile may include the positions of the electronic components on the PC board, and the connections between the electronic components. Accordingly, the PC board, including the traces (i.e., connections between electronic components), may be manufactured based on the netfile. The netfile may be viewed, printed, and/or transmitted electronically in any format. In one or more embodiments of the invention, the netfile adheres to the Electronic Design Interface Format (EDIF).

In one or more embodiments of the invention, the management engine (125) provides an interface to the component repository (105), the canvas (112), the protocol synthesizer (115), the edgelist generator (118), and the netfile generator (120). The management engine (125) may direct the activities of the system's (100) components (105, 112, 115, 118, 120) and translate data from one component into any format necessary for compatibility with another component (105, 110, 115, 118, 120).

Figure 4:
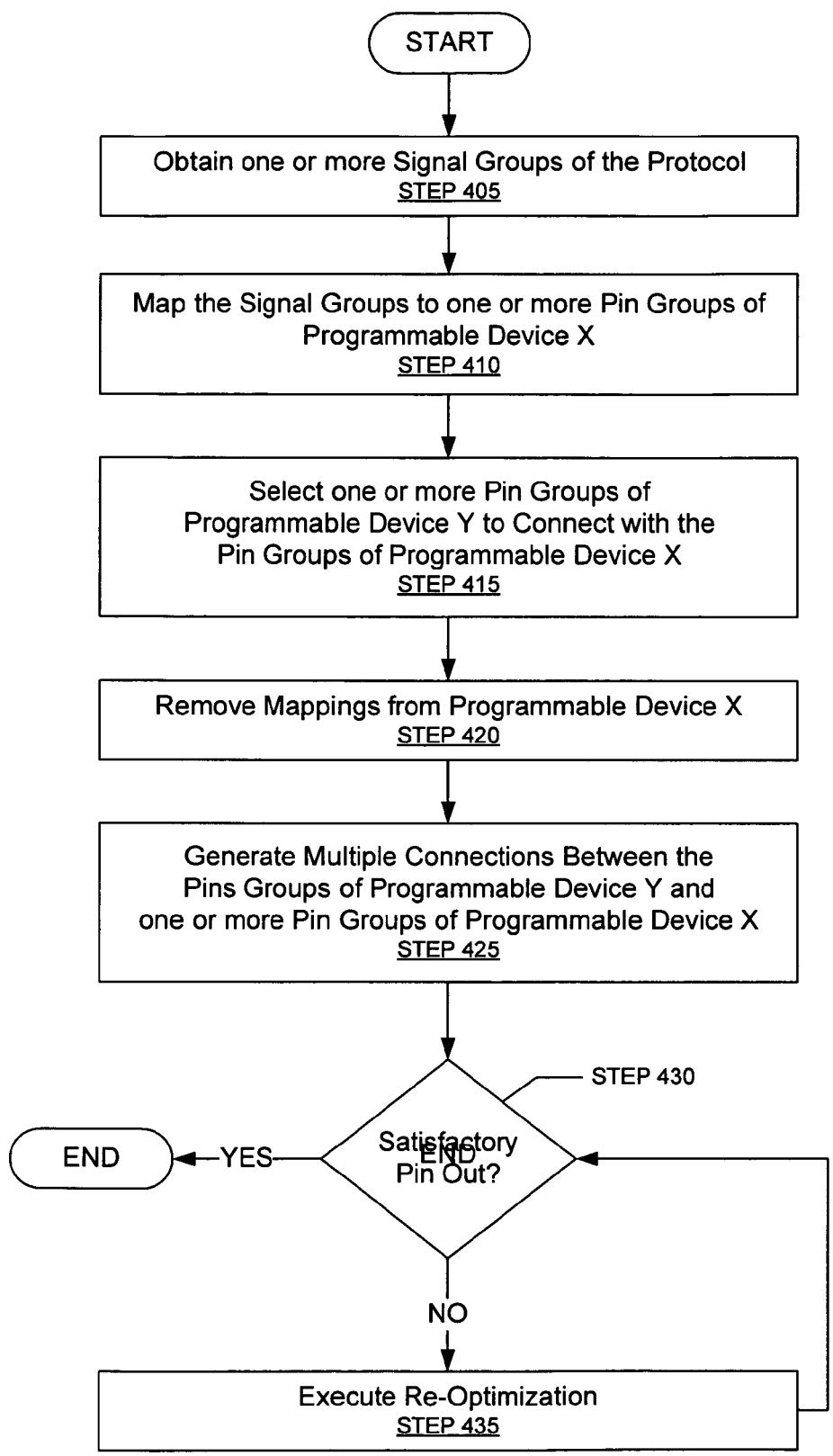
FIGS. 4-7 show flowcharts in accordance with one or more embodiments of an invention.

FIG. 4 shows a flowchart in accordance with one or more embodiments of the invention. The process shown in FIG. 4 may be used, for example, by system (100) to connect two programmable devices (i.e., Programmable Device X, Programmable Device Y) based on a protocol. Those skilled in the art, having the benefit of this detailed description, will appreciate that the sequence of steps shown in FIG. 4 may differ among embodiments of the invention, and that one or more steps may be optional. Further, one or more steps in FIG. 4 may be repeated.

Initially, one or more signal groups of the protocol are obtained (STEP 405). In STEP 410, the signal groups are mapped to one or more pin groups of the programmable device X. In other words, multiple pins of the programmable device X are chosen to realize the signals of the protocol. The chosen pins of the programmable device X have electrical constraints and logical constraints that are compatible with the electrical constraints and the logical constraints, respectively, of the signals.

In STEP 415, one or more pin groups of the programmable device Y are selected to connect with the pin groups of the programmable device X. In other words, multiple pins of programmable device Y are chosen for connection with the pins of the programmable device X, said pins of programmable device X being previously chosen to realize the signals of the protocol. The chosen pins of the programmable device Y have electrical constraints and logical constraints that are compatible with the electrical constraints and the logical constraints, respectively, of said pins of the programmable device X. Further, the chosen pins of the programmable device Y belong to pin groups selected based on one or more connection preferences.

In STEP 420, the mappings linking the signals of the protocol with the pins of the programmable device X are removed. In other words, the programmable device X is effectively reset.

In STEP 425, one or more pin groups of the programmable device X are chosen to connect with the previously chosen pin groups of programmable device Y. In other words, connections between the chosen pins of the programmable device X and the pins of the programmable device Y are generated. The chosen pins of programmable device X have electrical constraints and logical constraints that are compatible with the electrical constraints and the logical constraints, respectively, of the pins of the programmable device Y. Further, the chosen pins of programmable device X belong to pin groups selected based on the one or more connection preferences.

After the completion of STEP 425, schematics may be generated showing the proposed pin out for the programmable device X and the programmable device Y. However, the proposed pin out may require an excessive number of layers on the PC board to connect the programmable device X and the programmable device Y. Accordingly, the proposed pin layout may be deemed unsatisfactory. In STEP 430, it is determined whether the generated pin out is satisfactory. When it is determined that the pin out is satisfactory, the process ends. However, when it is determined that the pin out is unsatisfactory, the process proceeds to STEP 435.

In STEP 435, a re-optimization process is executed in an attempt to generate a satisfactory pin out. In one or more embodiments of the invention, the re-optimization process may be considered a feedback process. The feedback process may include marking pins in the pin out that are not optimal for routing/layout, identifying the layers corresponding to the pins, identifying the pin breakout on the PC board, and then applying one or more of the algorithms discussed in reference to FIG. 4 to generate new connections for the marked pins. These new connections should reduce the number of required layers to connect programmable device X and programmable device Y. STEP 435 may be repeated any number of times in order to generate a satisfactory pin out.

After the completion of the steps in FIG. 4, a netfile is generated including the position of programmable device X on a PC board, the position of programmable device Y on the PC board, and the generated connections from STEP 425 and/or STEP 435. Alternatively, the steps in FIG. 4 may repeat to connect the programmable device Y to additional programmable devices and/or non-programmable devices.

Those skilled in the art, having the benefit of this detailed description, will appreciate that the sequence of steps shown in FIG. 4 effectively generates connections between the programmable device X and the programmable device Y based on electronic constraints, logical constraints, group constraints of the protocol, and one or more connection preferences. Further, those skilled in the art, having the benefit of this detailed description, will also appreciate that in some embodiments of the invention, one or more connections preferences do not play a role in mapping the signals of the protocol to the pins of the programmable device X (i.e., STEP 410). Further still, those skilled in the art, having the benefit of this detailed description, will further appreciate that the generated connections may be used to manufacture the traces of one or more PC boards onto which the programmable device X and the programmable device Y can be attached (e.g., by soldering). Each of steps 405, 410, 415, 420, and 425 will be described in greater detail with reference to FIGS. 5-7.

Figure 5:
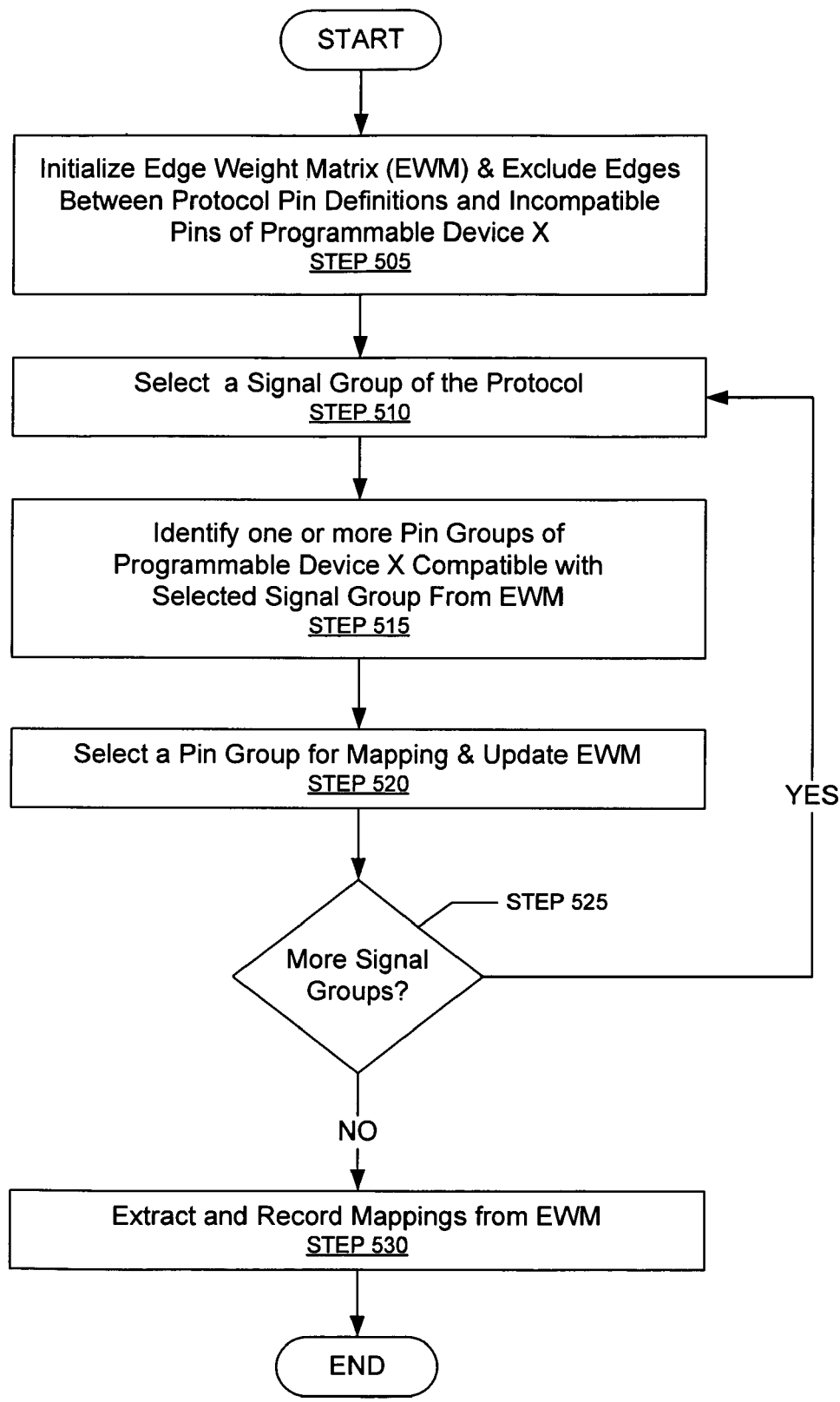

FIG. 5 shows a flowchart in accordance with one or more embodiments of the invention. The process shown in FIG. 5 may be an expanded view of STEP 405 and STEP 410 described above in reference to FIG. 4. In other words, the process shown in FIG. 5 may be used to map multiple signals of a protocol to pins of the programmable device X. Those skilled in the art, having the benefit of this detailed description, will appreciate that the sequence of steps shown in FIG. 5 may differ among embodiments of the invention, and that one or more of the steps may be optional. Further, one or more steps in FIG. 5 may be repeated.

Initially, an edge weight matrix (EWM) is initialized (STEP 505). One dimension of the EWM may represent the pins of the programmable device X, while another dimension of the EWM may represent the signals (i.e., pin definitions) of the protocol. In one or more embodiments of the invention, initializing the EWM may include populating all entries in the EWM with a dummy value (e.g., 1). Further, initializing the EWM may also include (i) identifying pins of the programmable device X that are unable to realize one or more signals of the protocol, and (ii) setting the edges in the EWM corresponding to the identified pins and signals of (i) to the exclusion value.

In STEP 510, a signal group of the protocol is selected. In one or more embodiments of the invention, the signal group with the greatest number of signals is selected first. Alternatively, the signal group with the fewest number of signals is selected first. As yet another alternative, a signal group is selected at random.

As discussed above, each signal group includes multiple signals, and each signal is defined by electrical constraints and logical constraints. In one or more embodiments of the invention, each signal group also includes a group constraint which specifies additional requirements when mapping the signal group to the programming device X, and when generating connections between the programming device X and the programming device Y. For example, a group constraint may require all signals in the signal group be mapped to the same pin group of the programmable device X, and connected to the same pin group of the programmable device Y. Alternatively, a group constraint may allow the signals of the groups to be mapped to any pin group of the programmable device X.

In STEP 515, one or more pin groups of the programmable device X are identified for potential realization of the signals in the selected signal group. In one or more embodiments of the invention, a pin group of the programmable device X is deemed compatible with the selected signal group if (i) the number of pins in said pin group equals or exceeds the number of signals in the selected pin group, and (ii) for each signal in the signal group, there exists at least one pin in said pin group that is able to realize the signal. Those skilled in the art having the benefit of this detailed description, will appreciate requirement (i) can be dropped if and only if the group constraint of the selected signal group does not require all the signals be mapped to the same pin group.

In one or more embodiments of the invention, if a pin group of the programmable device X fails requirement (i) and/or requirement (ii), the edges in the EWM corresponding to said pin group and the selected signal group are set to the exclusion value.

In STEP 520, one or more pin groups of the programmable device X now remain for realizing the signals of the selected signal group (i.e., the other pin groups have been excluded from consideration). In one or more embodiments of the invention, the smallest of the remaining pin groups is selected for realizing the signals of the signal group. Alternatively, one of the remaining pin groups is selected at random for realizing the signals of the selected signal group.

In one or more embodiments of the invention, a pin group having all pins in the same layer of the PC board is selected for realizing the signals of the selected signal group. Accordingly, all signals in the selected signal group will be mapped to pins that are in the same layer of the PC board. In one or more embodiments of the invention, a pin group which is close in proximity to another "mapped" pin group on the die of programmable device X is selected for realizing the signals of the selected signal group. In one or more embodiments of the invention, a pin group which is close to another "mapped" pin group on the package of the electronic component is selected for realizing the signals of the selected signal group. Any of these preferences for selecting a pin group to realize the selected signal group may be set by an end user. The end user may assign priorities to one or more of these and all other types of preferences (e.g., connection preferences). Accordingly, if a mapping according to the preference with the highest priority is not possible, a mapping according to the preference with the second highest priority is attempted, etc.

In one or more embodiments of the invention, once a pin group of the programmable device X is selected for realizing the signals of the selected signal group, all edges in the EWM that are not associated with both the signal group and the selected pin group are set to the exclusion value.

Those skilled in the art, having the benefit of this detailed description, will appreciate that although a pin group has been selected for realizing the signals of the selected signal group, choices may still remain for mappings within the selected pin group of the programmable device X. For example, consider a selected pin group with N pins and a selected signal group of K signals, where N>K. There may exist N!/(N−K)! different ways to map the K signals to the N pins. In one or more embodiments of the invention, a permutation is selected at random. Alternatively, a permutation may be selected based on any of the above mentioned connection preferences. Once a signal is mapped to a pin (i.e., an edge is chosen), all the other edges in the EWM corresponding to said pin are set to the exclusion value, and all the other edges in the EWM corresponding to said signal are set to the exclusion value.

In STEP 525, it is determined whether additional signal groups of the protocol need to be mapped to one or more pin groups of the programmable device X. When it is determined that additional signal groups remain, the process returns to STEP 510. When it is determined that no signal groups remain for mapping, the process proceeds to STEP 530.

In STEP 530, the mappings are extracted from the EWM and recorded (e.g., stored in a file). In one or more embodiments of the invention, extracting the mappings includes searching every row of the EWM for the lowest edge value. The mapping between the signal and the pin corresponding to the lowest edge value is recorded along with the electrical constraints and/or the electrical constraints of said signal, and the group constraints of the one or more signal groups.

Figure 6:
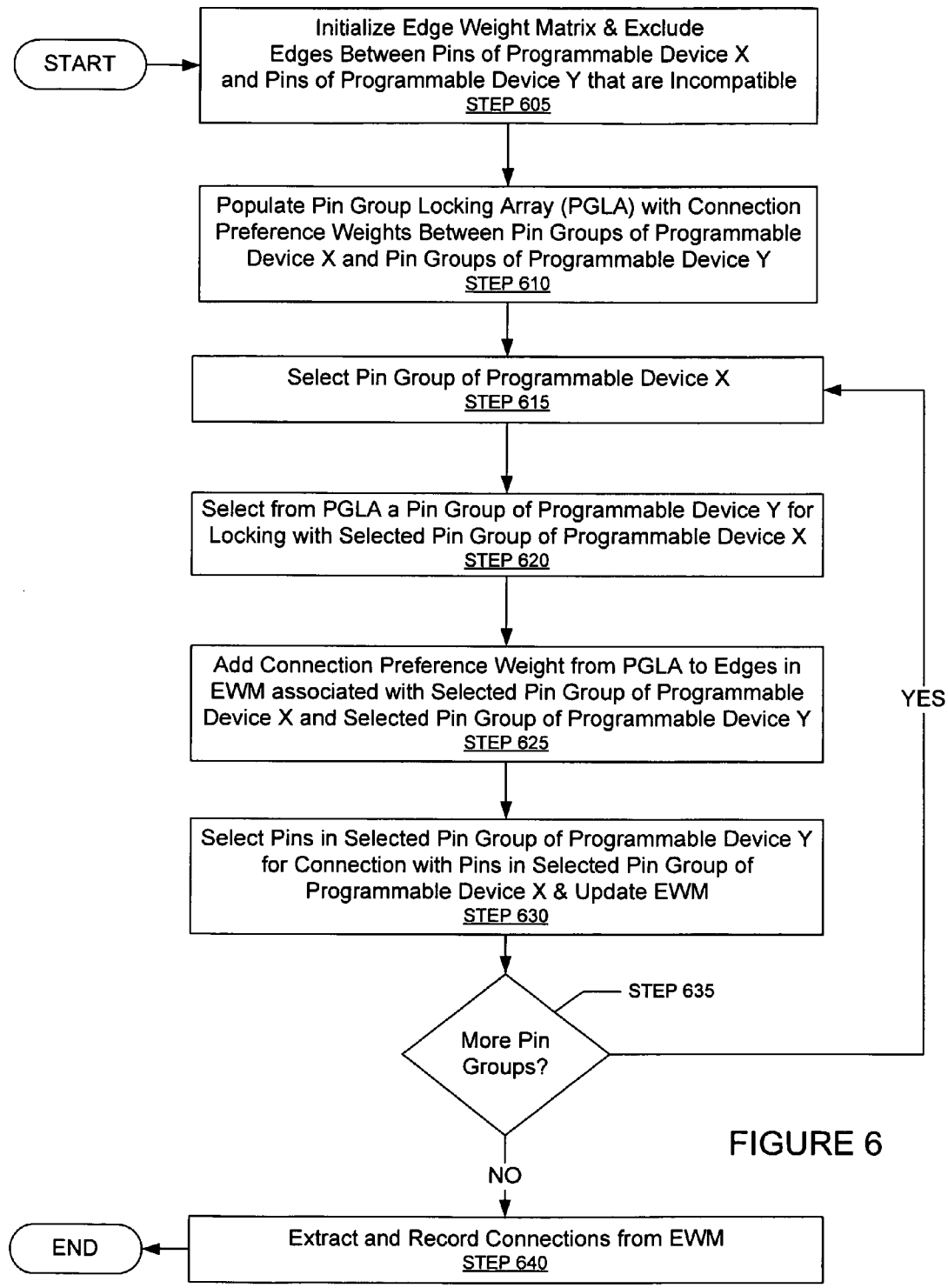

FIG. 6 shows a flowchart in accordance with one or more embodiments of the invention. The process shown in FIG. 6 may be an expanded view of STEP 415 discussed above in reference to FIG. 4. In other words, the process shown in FIG. 6 may be used to connect pins of the programmable device Y with the pins of the programmable device X, where said pins of the programmable device X have previously been chosen to realize the signals of the protocol. Those skilled in the art, having the benefit of this detailed description, will appreciate that the sequence of steps shown in FIG. 6 may be different among embodiments of the invention, and that one or more of the steps may be optional. Further, one or more steps of FIG. 6 may be repeated.

Initially, an Edge Weight Matrix (EWM) is initialized (STEP 605). One dimension of the EWM may represent the pins of the programmable device X, while another dimension of the EWM may represent pins of the programmable device Y. In one or more embodiments of the invention, the EWM is initialized by populating all entries with a dummy value (e.g., 1). Further, all edges in the EWM corresponding to connections between incompatible pins of the programmable device X and the programmable device Y are set to the exclusion value.

In STEP 610, a pin group locking array (PGLA) is populated according to the one or more connection preferences. One dimension of the PGLA may represent the pin groups of the programmable device X, while another dimension of the PGLA may represent the pin groups of the programmable device Y. In one or more embodiments of the invention, for any pin group of the programmable device Y that does not include a sufficient number of pins to connect with a pin group of the programmable device X, the edge in the PGLA corresponding to both said pin group of programmable device X and said pin group of programmable device Y is set the exclusion value. In one or more embodiments of the invention, if a pin group of the programmable device Y does not include at least one compatible pin for each pin in a pin group of programmable device X, the edge in the PGLA corresponding to both said pin group of the programmable device Y and said pin group of the programmable device X is set to the exclusion value.

In one or more embodiments of the invention, the connection preference is a length matching preference. In such embodiments, each connection preference weight in the PGLA represents an absolute difference between the longest connection length (e.g., Manhattan distance) and the shortest connection length between corresponding pin groups. Alternatively, the connection preference may be a smallest fit preference. Accordingly, each connection preference weight in the PGLA may represent an absolute difference between the sizes (i.e., number of pins) of the corresponding pin groups. As yet another alternative, the connection preference may be a nearest fit preference. Accordingly, each connection preference weight in the PGLA may represent the average distance (e.g., Manhattan distance) between the corresponding pin groups. Further, as yet another alternative, the connection preference may be a least displacement factor. Accordingly, each connection preference weight in the PGLA may represent the displacement factor between the corresponding pin groups.

In one or more embodiments of the invention, as discussed above, the connection preference weight may be a weighted sum or product of any number of connection preference weights from a variety of connection preferences (e.g., nearest fit preference+least displacement factor).

In STEP 615, a pin group of the programmable device X is selected (hereinafter "PGX"). At least one pin in the PGX must realize a signal of the protocol. In one or more embodiments of the invention, the PGX is the largest pin group of the programmable device X. Alternatively, the PGX is the smallest pin group of the programmable device X. As yet another alternative, the PGX is a random selection from the pin groups of the programmable device X.

In STEP 620, the smallest connection preference weight in the PGLA for the PGX is identified, and the pin group of the programmable device Y corresponding to said smallest connection preference weight (hereinafter "PGY") is selected for locking with the PGX. In one or more embodiments of the invention, all edges in the PGLA associated with the PGX but not the PGY are set to the exclusion value. Similarly, all edges in the PGLA associated with the PGY but not the PGX are set to the exclusion value.

In STEP 625, the smallest connection preference weight (i.e., STEP 620) is added to all edges in the EWM corresponding to both the PGX and the PGY. Further all edges in the EWM corresponding to the PGX but not the PGY are set to the exclusion value. Similarly, all edges in the EWM corresponding to the PGY but not the PGX are set the to exclusion value.

In one or more embodiments of the invention, additional values may be added to (or subtracted from) the edge values in the EWM corresponding to the PGX and the PGY. These additional values may be used to encourage and/or discourage specific pin connections between the PGY and the PGX. For example, these additional values may encourage the selection of pins that are in a single layer of the PC board, pins that are close in proximity on the die of the programmable device Y, or pins that are close in proximity on the package of programmable device Y.

In STEP 630, pins in the PGY are selected for connection with the pins in the PGX. In one or more embodiments of the invention, for a pin of the PGX, the smallest edge value in the EWM corresponding to said pin of the PGX is identified, and the pin of the PGY corresponding to said smallest edge value is deemed the pin of PGY for connecting with said pin of PGX. All edges in the EWM associated with said pin of the PGY but not said pin of the PGX may be set to the exclusion value. Similarly, all edges in the EWM associated with said pin of the PGX but not said pin of the PGY may be set to the exclusion value.

In STEP 635, it is determined if there are any additional pin groups in the programmable device X for selection. When it is determined there are additional pin groups in the programmable device X, the process returns to STEP 615, otherwise, the process proceeds to STEP 640.

In STEP 640, the connections are extracted from the EWM and recorded (e.g., stored in a file). In one or more embodiments of the invention, extracting the connections includes searching every row of the EWM for the lowest edge value. The connection between the two pins corresponding to the lowest edge value is recorded along with the electrical constraints and/or the electrical constraints of said signal, and the group constraints of the one or more signal groups.

In one or more embodiments of the invention, as an alternative to STEP 620 and STEP 625, a pin group of the programmable device Y having all pins in a single layer of the PC board is selected for connection with the PGX. As yet another alternative, a pin group of the programmable device Y which is close in proximity to another pin group on the die of programmable device Y is selected for connection with the PGX. As a further alternative, a pin group of the programmable device Y that is close to another pin group on the package of the programmable device Y is selected for connection with the PGX. Any of these preferences for selecting a pin group of the programmable device Y may be set by an end user. The end user may assign priorities to one or more of these and all other preferences (e.g., connection preferences). Accordingly, if a connection based on the preference with the highest priority is not possible, a connection based on the preference with the second highest priority is attempted, etc.

Figure 7:
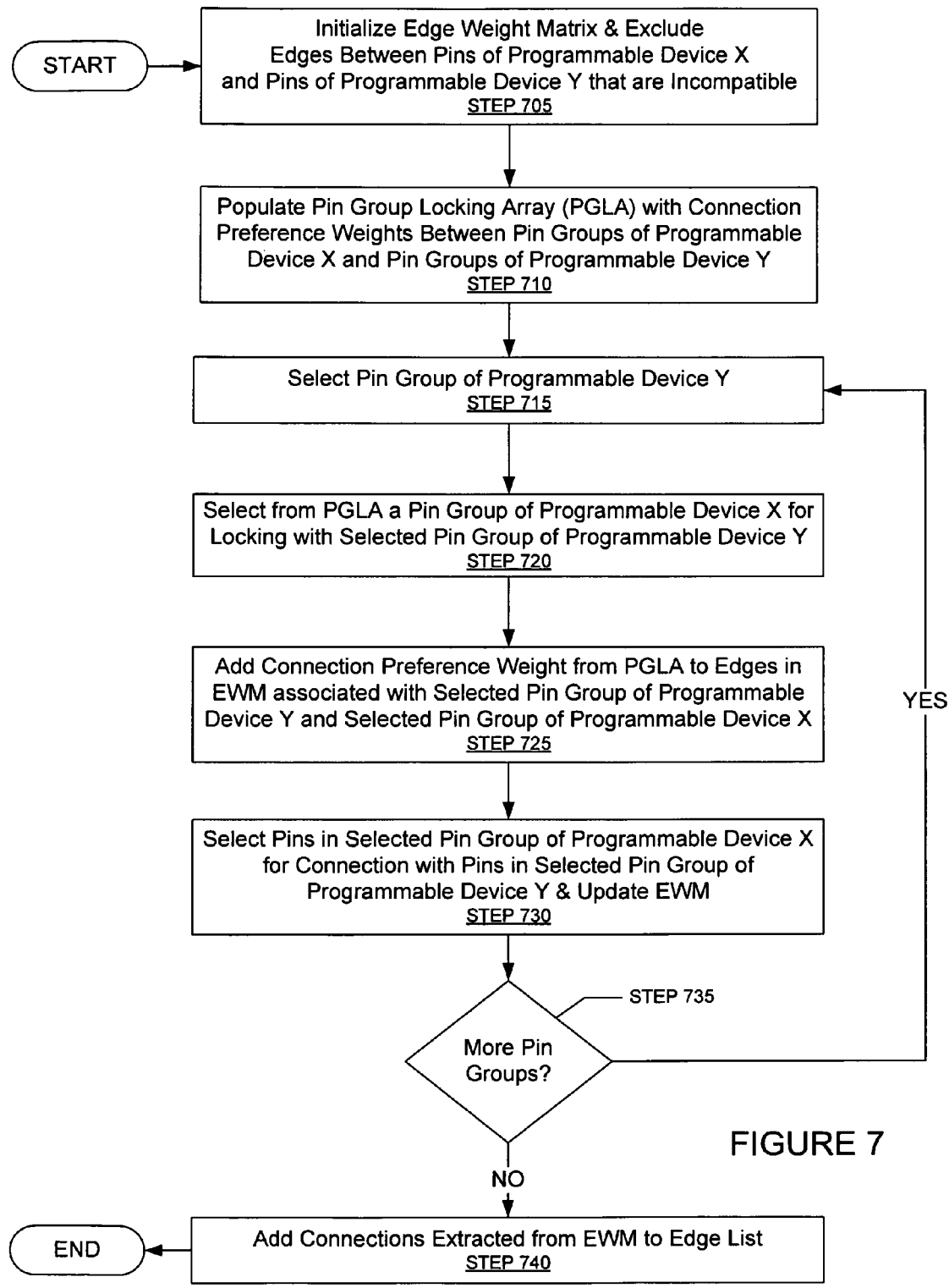

FIG. 7 shows a flowchart in accordance with one or more embodiments of the invention. The process shown in FIG. 7 may be an expanded view of STEP 425 discussed above in reference to FIG. 4. In other words, the process shown in FIG. 7 may be used to connect pins of the programmable device X with the pins of the programmable device Y, where the pins of the programmable device Y were previously chosen (i.e., STEP 415) for connection with mapped pins of programmable device X. Those skilled in the art, having the benefit of this detailed description, will appreciate that the sequence of steps shown in FIG. 7 may be different among embodiments of the invention, and that one or more of the steps may be optional. Further, one or more steps of FIG. 7 may be repeated.

Initially, an Edge Weight Matrix (EWM) is initialized (STEP 705). In one or more embodiments of the invention, STEP 705 is essentially the same as STEP 605, discussed above in reference to FIG. 6.

In STEP 710, a pin group locking array (PGLA) is populated according to the one or more connection preferences. One dimension of the PGLA may represent the pin groups of the programmable device Y, while another dimension of the PGLA may represent the pin groups of the programmable device X. In one or more embodiments of the invention, for any pin group of the programmable device X that does not include a sufficient number of pins to connect with a pin group of programmable device Y, the edge in the PGLA corresponding to both said pin group of programmable device Y and said pin group of programmable device X is set to the exclusion value.

In one or more embodiments of the invention, if a pin group of the programmable device X does not include at least one compatible pin for each pin in a pin group of programmable device Y, the edge in the PGLA corresponding to both said pin group of programmable device X and said pin group of programmable device Y is set to the exclusion value.

In one or more embodiments of the invention, STEP 710 is essentially the same as STEP 610, discussed above in reference to FIG. 6. Accordingly, in one or more embodiments of the invention, the connection preference weight may be a weighted sum or average of any number of connection preference weights from a variety of connection preferences (e.g., nearest fit preference+least displacement factor).

In STEP 715, a pin group of the programmable device Y is selected (hereinafter "PGY"). At least one pin in the PGY must have been chosen for connection with a mapped pin of the programmable device X (i.e., STEP 415). In one or more embodiments of the invention, the PGY is the largest pin group of the programmable device Y. Alternatively, the PGY is the smallest pin group of the programmable device Y. As yet another alternative, the PGY is a random selection from the pin groups of the programmable device Y.

In STEP 720, the smallest connection preference weight in the PGLA for the PGY is identified, and the pin group of the programmable device X corresponding to said smallest connection preference weight (hereinafter "PGX") is selected for locking with the PGY. In one or more embodiments of the invention, all edges in the PGLA associate with the PGX but not the PGY are set to the exclusion value. Similarly, all edges in the PGLA associated with the PGY but not the PGX are set to the exclusion value.

In STEP 725, the smallest connection preference weight (i.e., STEP 720) is added to all edges in the EWM corresponding to both the PGX and the PGY. Further all edges in the EWM corresponding to PGX but not PGY are set to the exclusion value. Similarly, all edges in the EWM corresponding to the PGY but not the PGX are set the to exclusion value.

In one or more embodiments of the invention, additional values may be added to (or subtracted from) the edge values in the EWM corresponding to the PGX and the PGY. These additional values may be used to encourage and/or discourage specific pin connections between the PGY and the PGX.

In STEP 730, pins in the PGX are selected for connection with the pins in the PGY. In one or more embodiments of the invention, for a pin of the PGY, the smallest edge value in the EWM corresponding to said pin of the PGY is identified, and the pin of the PGX also corresponding to said smallest edge value is deemed the pin of the PGX for connecting with said pin of the PGY. All edges in the EWM associated with said pin of the PGY but not said pin of the PGX may be set to the exclusion value. Similarly, all edges in the EWM associate with said pin of the PGX but not said pin of the PGY may be set to the exclusion value.

In STEP 735, it is determined if there are any remaining pin groups in the programmable device Y for selection. When it is determined there are additional pin groups in the programmable device Y, the process returns to STEP 715, otherwise, the process proceeds to STEP 740.

In STEP 740, the connections are extracted from the EWM and added to an edgelist. In one or more embodiments of the invention, extracting the connections includes searching every row of the EWM for the lowest edge value. The connection between the two pins corresponding to the lowest edge value is added to the edgelist to effectively generate the connection.

In one or more embodiments of the invention, as an alternative to STEP 720 and STEP 725, a pin group of the programmable device X having all pins in a single layer of the PC board is selected for connection with the PGY. As yet another alternative, a pin group of the programmable device X which is close in proximity to another pin group on the die of programmable device X is selected for connection with the PGX. As a further alternative, a pin group of the programmable device X that is close to another pin group on the package of the programmable device X is selected for connection with the PGY. Any of these preferences for selecting a pin group of the programmable device X may be set by an end user. The end user may assign priorities to one or more of these and all other preferences (e.g., connection preferences). Accordingly, if a connection based on the preference with the highest priority is not possible, a connection based on the preference with the second highest priority is attempted, etc.

FIG. 8 is an example in accordance with one or more embodiments of the invention. As shown in FIG. 8, a protocol is being generated using a protocol synthesis graphical user interface (GUI) (800). The GUI (800) may be essentially the same as the GUI (114), discussed above in reference to FIG. 1. The interface (800) effectively allows a user to create one or more signal groups (805), with each signal group having multiple pin definitions (e.g., Pin Definition (820)). Further, the GUI (800) allows the user to specify a group constraint (821) for the signal group (805), and both the electrical constraints (810) (e.g., pin voltage, IO Standard, etc.) and the logical constraints (815) (e.g., pin type) for each pin definition (820). Any field in the GUI (800) may be populated through keyboard input. Alternatively, the user may populate one or more fields of the GUI (800) by selecting items from a drop-down list (e.g., storing common electrical constraints, logical constraints, group constraints, etc.) and/or other well known GUI widgets. The GUI (800) may also have auto-populate features for similar or predictable fields of the protocol (i.e., Data[0], Data[1], Data[2], ..., Data[7]). Once the user is finished defining the protocol, the protocol may be saved in any format. Alternatively, the entire protocol may be input from a file.

Figure 9:
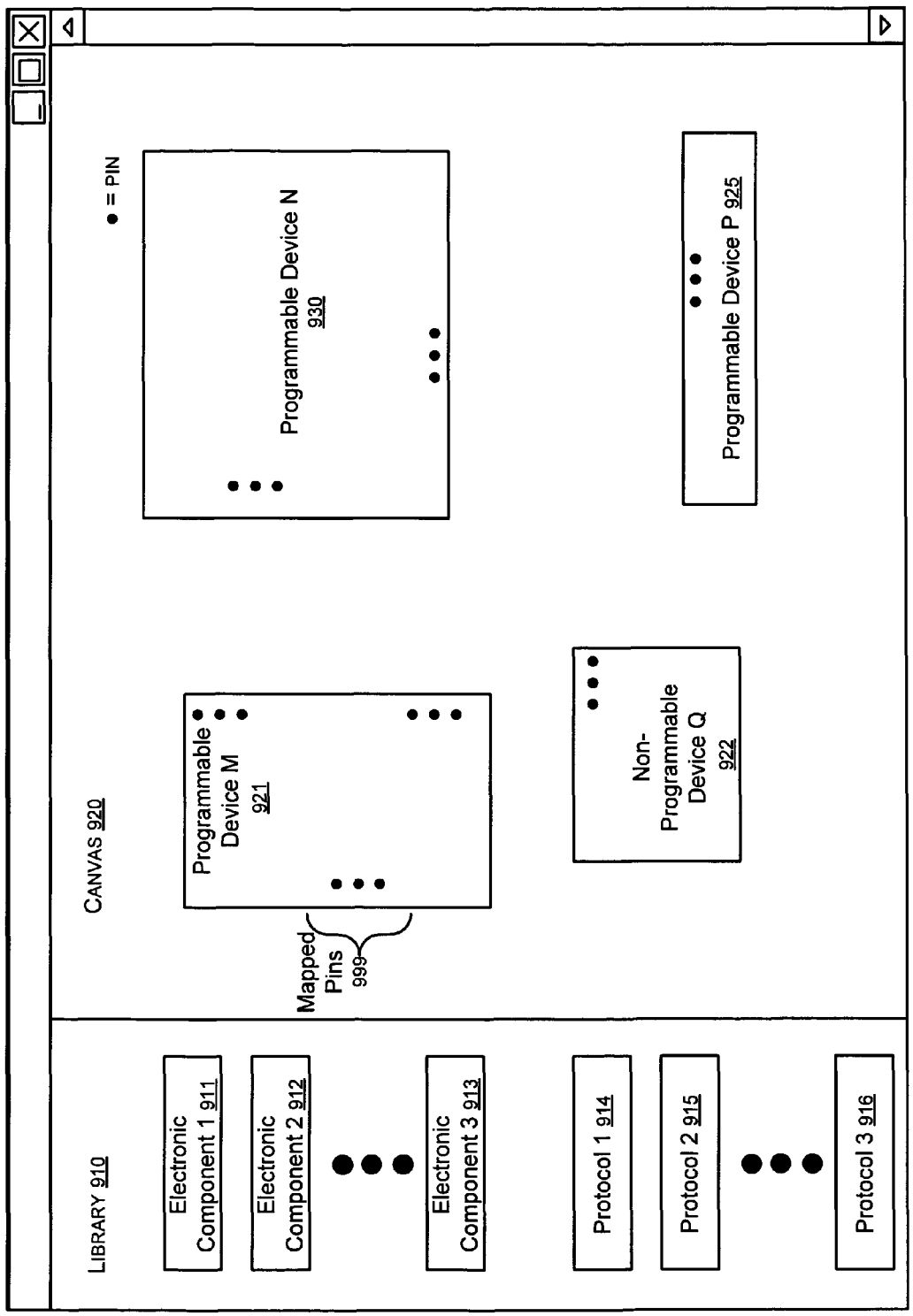

FIG. 9 is an example in accordance with one or more embodiments of the invention. As shown in FIG. 9, multiple programmable devices (i.e., Programmable Device M (921), Programmable Device N (930), Programmable Device P (925)) are positioned on a canvas (920). A non-programmable device (i.e., Non-Programmable Device Q (922)) is also positioned on the canvas (920).

The canvas (920) may be essentially the same as the canvas (112), discussed above in reference to FIG. 1. As also shown in FIG. 9, a library (910) includes the electronic component files (911, 912, 913) for multiple electronic components including the programmable devices (921, 922, 925, 930). The library (910) also stores one or more protocols (i.e., protocol 1 (914), protocol 2 (915), protocol 3 (916)). The library (910) may be essentially the same as the component repository (105), discussed above in reference to FIG. 1.

In FIG. 9, the multiple electronic components (921, 922, 925, 930) are to be connected according to the protocol 1 (914). As an initial step in connecting the multiple electronic components (921, 925, 930), the signals of the protocol 1 (914) are mapped to pins (i.e., Mapped Pins (999)) of programmable device M (921). In other words, the mapped pins (999) of programmable device M (921) are the realizations of the signals of the protocol 1 (914). The mapped pins (999) satisfy the electrical constraints, the logical constraints, and the group constraints of the signals of the protocol 1 (914). The process for mapping the signals of the protocol 1 (914) to the pins (999) of the programmable device M (921) may follow essentially the same steps as described in FIG. 5.

Figure 10:
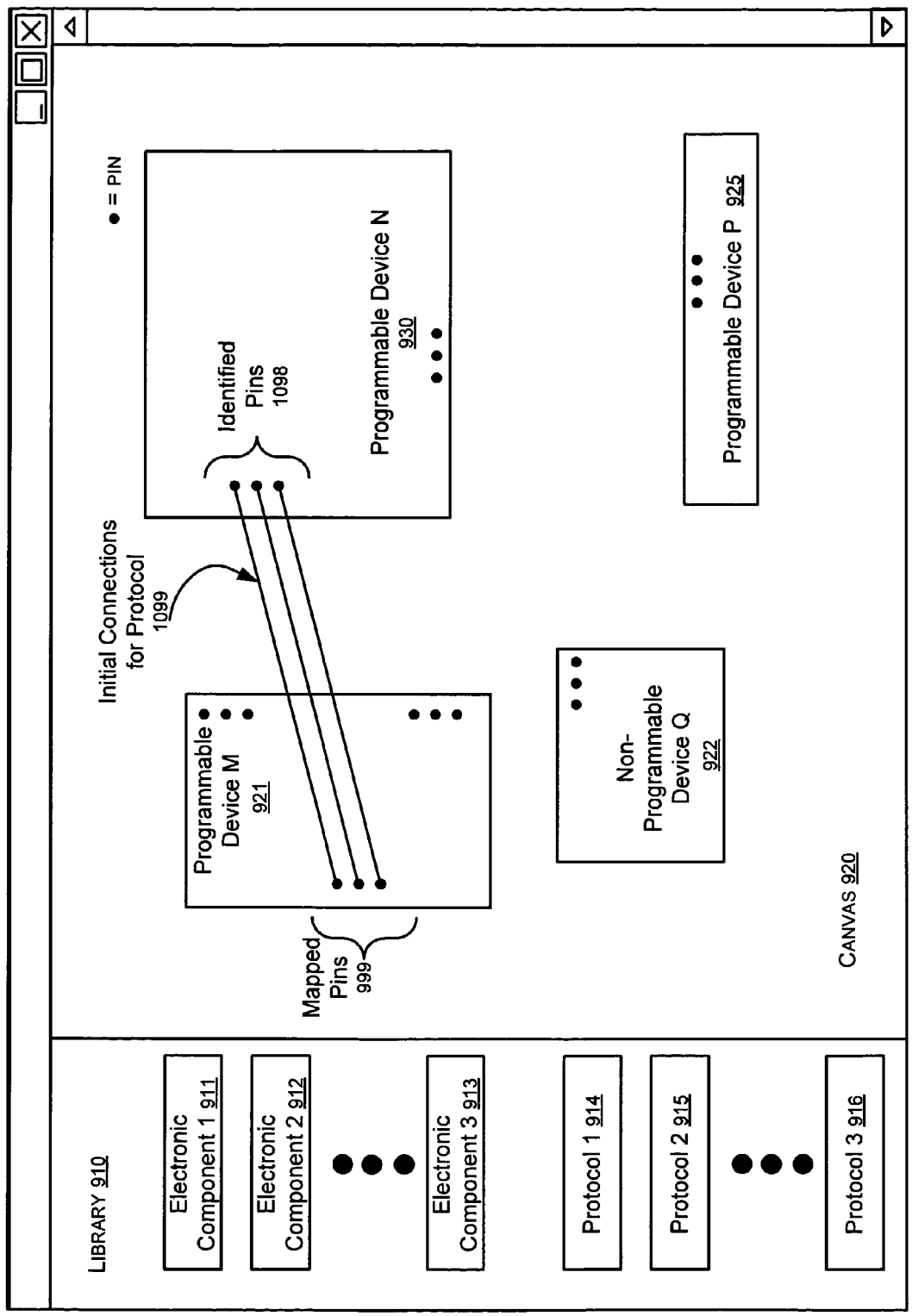

FIG. 10 is an example in accordance with one or more embodiments of the invention. FIG. 10 is essentially the same as FIG. 9, except FIG. 10 shows an additional step in connecting the multiple electronic components (921, 922, 925, 930) based on the protocol 1 (914). Specifically, as shown in FIG. 10, multiple pins (i.e., Identified pins (1098)) of the programmable device N (930) have been identified for connection with the mapped pins (999) of the programmable device M (921). Thus, the identified pins (1098) are compatible with the electrical constraints, the logical constraints, and the group constraints of the signals in the protocol 1 (914). Further, the identified pins (1098) are also selected based one or more connection preferences (e.g., a length matching preference, a smallest fit preference, a nearest fit preference, a least displacement preference, etc.) set by the protocol 1 (914) and/or by the user. The process for determining the identified pins (1098) of the programmable device N (930) may follow essentially the same steps as described in FIG. 6.

Figure 11:
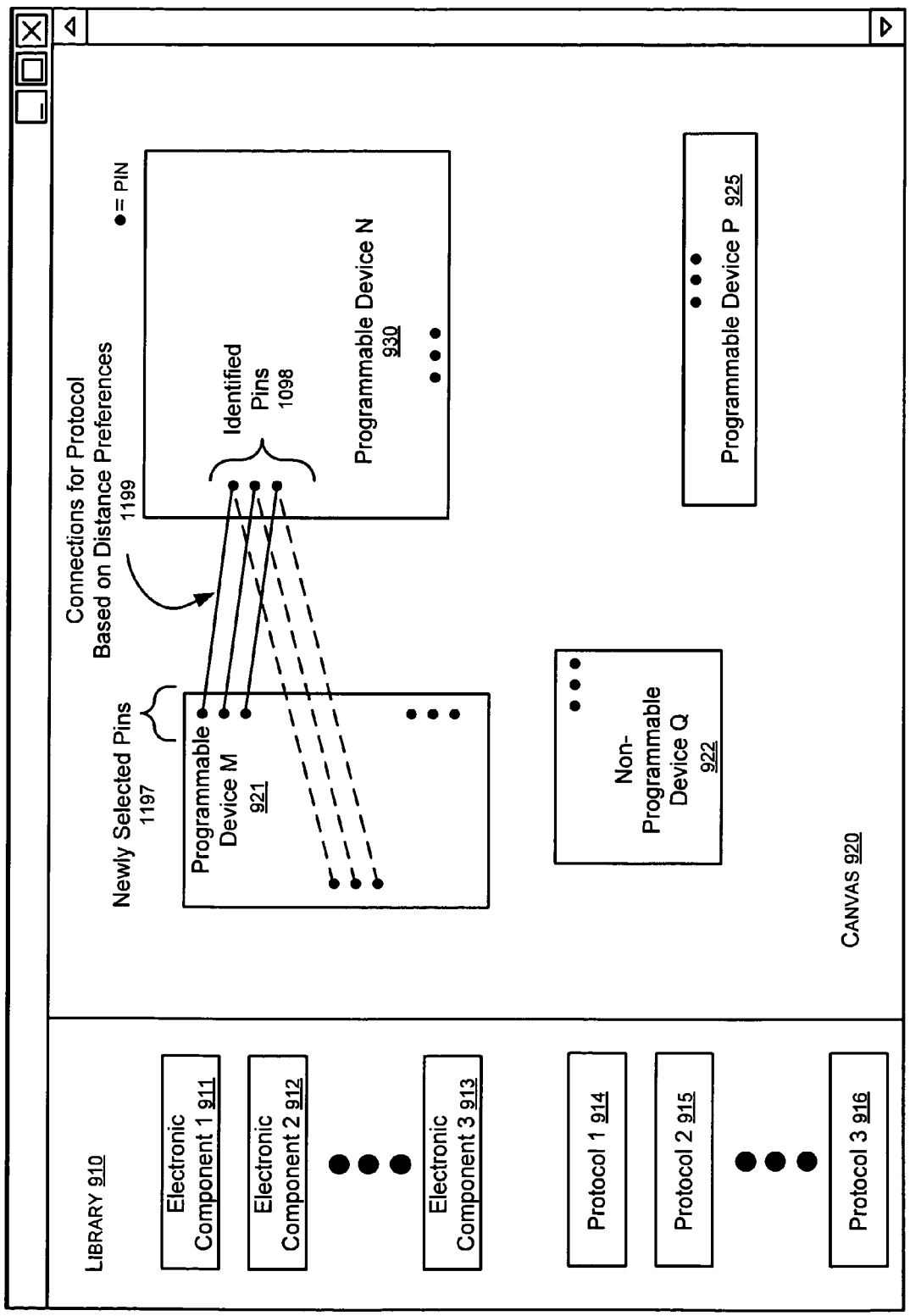

FIG. 11 is an example in accordance with one or more embodiments of the invention. FIG. 11 is essentially the same as FIG. 10, except FIG. 11 shows yet an additional step in connecting the multiple electronic components (921, 925, 930) based on the protocol 1 (914). Specifically, as shown in FIG. 11, the mappings have been removed from the programmable device M (921). Further, the newly selected pins (1197) on the programmable device M (921) have been chosen to connect with the identified pins (1098) of the programmable device N (930). Thus, the newly selected pins (1197) are compatible with the electrical constraints, the logical constraints, and the group constraints of the signals in the protocol 1 (914). Further, the newly selected pins (1197) are further determined based on one or more connection preferences (discussed above). Accordingly, the new connections between the two programmable devices can be generated and displayed. The process for determining the newly selected pins (1197) of the programmable device M (921) may follow essentially the same steps as described in FIG. 7.

Figure 12:
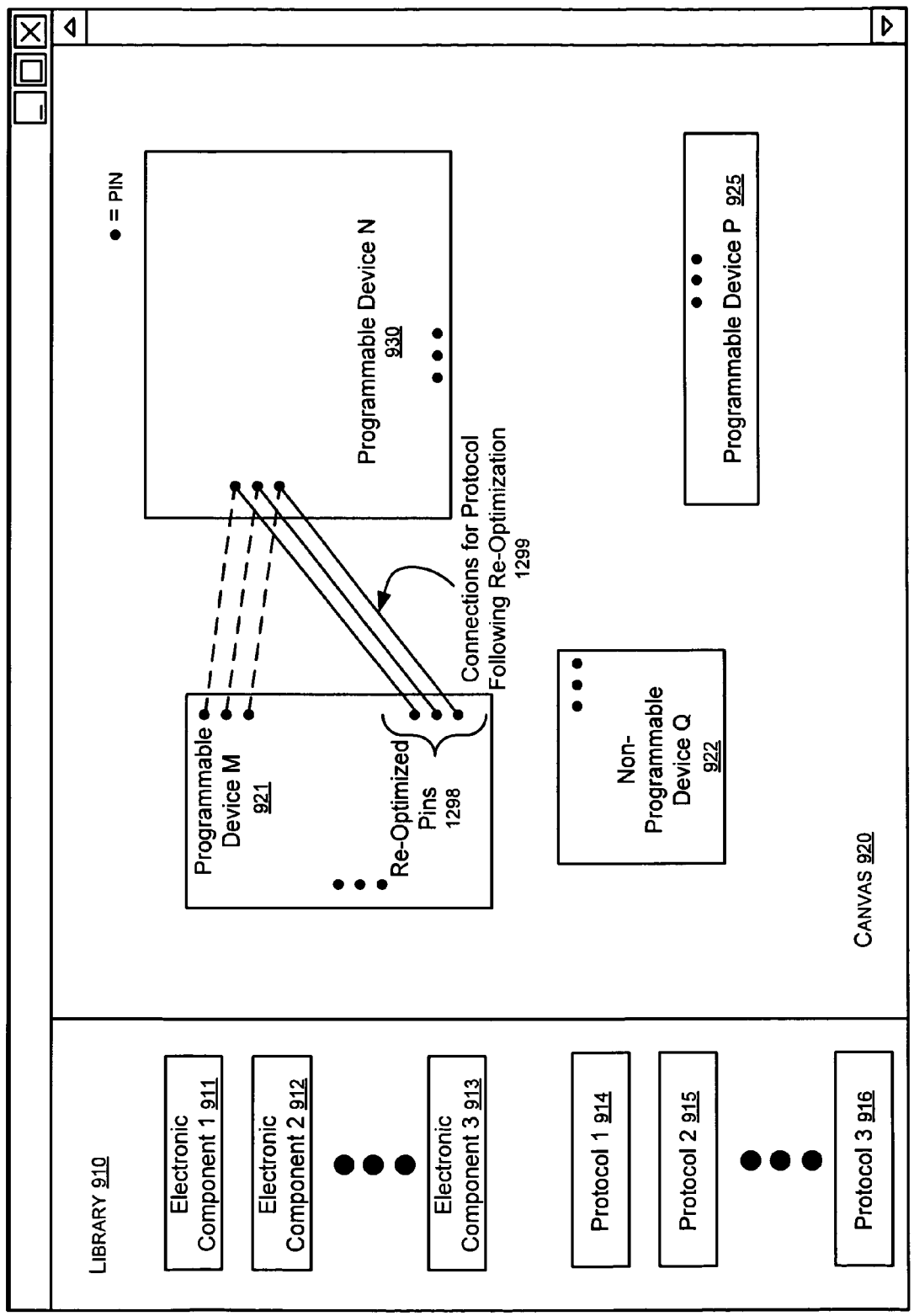

FIG. 12 is an example in accordance with one or more embodiments of the invention. FIG. 12 is essentially the same as FIG. 11, except FIG. 12 shows yet an additional step in connecting the multiple electronic components (921, 922, 925, 930) based on the protocol 1 (914). Specifically, as shown in FIG. 12, the re-optimized pins (1298) are selected for connection with the programmable device N (930). The re-optimized pins (1298) are selected as part of a re-optimization process (e.g., STEP 435, discussed above in reference to FIG. 4). In other words, re-optimized pins (1298) are selected instead of the newly selected pins (1197) (discussed above in reference to FIG. 11) because the connections (1299) corresponding to the re-optimized pins (1298) reduce the number of required layers on the PC board, where the PC board is represented by the canvas (920).

Figure 13:
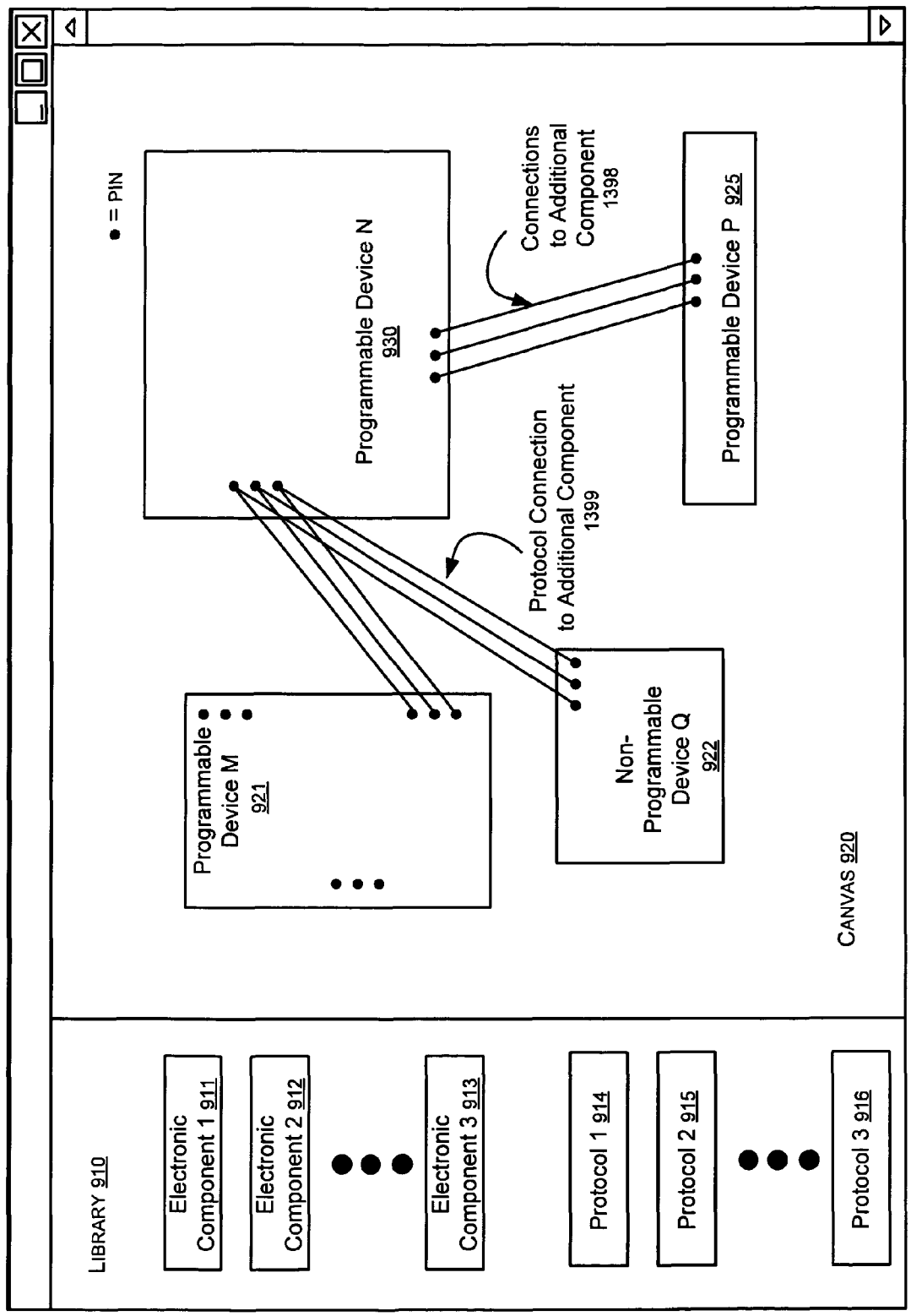

FIG. 13 is an example in accordance with one or more embodiments of the invention. FIG. 13 is essentially the same as FIG. 12, except FIG. 13 shows yet an additional step in connecting the multiple electronic components (921, 922, 925, 930). As shown in FIG. 13, connections (1399) according to protocol 1 (914) are made between the programmable device N (930) and non-programmable device Q (922). The process for making the connections (1399) between the programmable device N (930) and the non-programmable device Q (922) may be essentially the same as the process for connecting the programmable device M (921) and the programmable device N (930). Now, the programmable device M (921), the programmable device N (930), and the non-programmable device Q (922) are all connected according to protocol 1 (914). In this configuration, these electronic components (921, 922, 930), for example, may share signal processing workloads. The mentioned processes may be repeated to generate connections (1398) between the programmable device N (930) and the programmable device P (925) according to a protocol (e.g., Protocol 1 (914), Protocol 2 (915), etc.).

Figure 14:
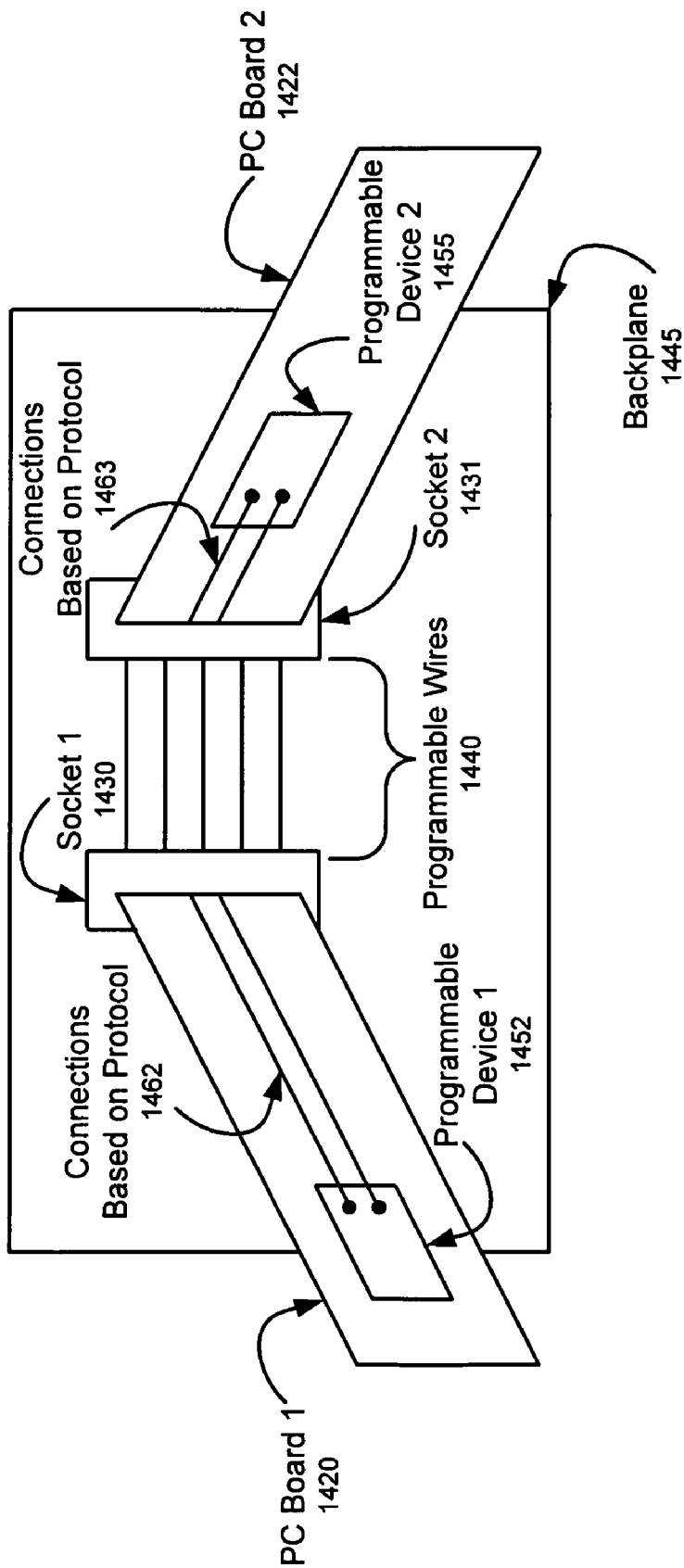

FIG. 14 shows an example in accordance with one or more embodiments of the invention. As shown in FIG. 14, multiple PC boards (i.e., PC Board 1 (1420), PC Board 2 (1422)) are plugged into a backplane (1445) using multiple sockets (i.e., Socket 1 (1430), Socket 2 (1431)). The PC Board 1 (1420) includes the programmable device 1 (1452), while the PC Board 2 (1422) includes the programmable device 2 (1455). Further, the backplane (1445) includes programmable wires (1440) connecting the sockets (1430, 1431).

In the example of FIG. 14, it is desired to connect the programmable device 1 (1452) and the programmable device 2 (1455) based on a protocol. As an initial step, the signals of the protocol may be mapped to the pins of the programmable device 1 (1452) according to the electrical constraints, the logical constraints, and the group constraints of the protocol. Next, the pins of the programmable device 1 (1452) are mapped to the pins of the socket 1 (1430) based on the electrical constraints, the logical constraints, and the group constraints of the protocol, and further based on one or more connection preferences (discussed above). Next, the programmable wires (1440) are configured such that the socket 1 (1430) and the socket 2 (1431) are programmed in a equivalent manner (i.e., programmed such that the socket 1 (1430) and the socket 2 (1431) are virtually identical). Finally, the mappings are removed from the PC Board 1 (1420), and the pins of the socket 1 (1430) are connected to pins of the programmable device 1 (1452) according to the electrical constraints, the logical constraints, and the group constraints of the protocol, and further according to the one or more connection preferences. Similarly, the pins of the socket 2 (1431) are connected to pins of the programmable device 2 (1455) according to the electrical constraints, the logical constraints, and the group constraints of the protocol, and further according to the one or more connection preferences. As a result, the PC Board 1 (1420) and the PC board 2 (1422) are connected according to a protocol despite being located on different PC boards.

Figure 15:
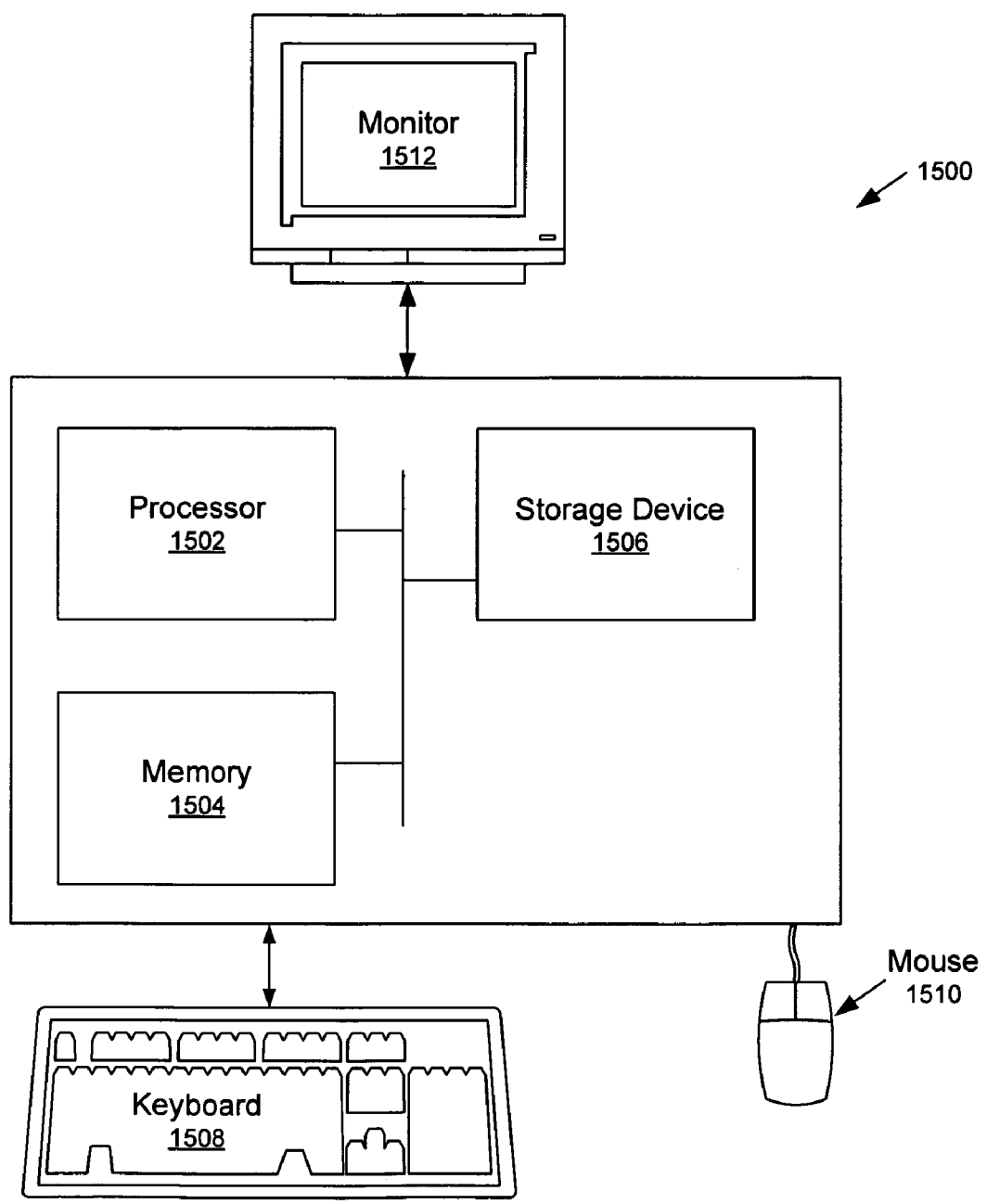
FIG. 15 shows a computer system in accordance with one embodiment of the invention.

The invention may be implemented on virtually any type of computer regardless of the platform being used. For example, as shown in FIG. 15, a computer system (1500) includes a processor (1502), associated memory (1504), a storage device (1506), and numerous other elements and functionalities typical of today's computers (not shown). The computer (1500) may also include input means, such as a keyboard (1508) and a mouse (1510), and output means, such as a monitor (1512). The computer system (1500) is connected to a local area network (LAN) or a wide area network (e.g., the Internet) (not shown) via a network interface connection (not shown). Those skilled in the art will appreciate that these input and output means may take other forms.

Further, those skilled in the art will appreciate that one or more elements of the aforementioned computer system (1500) may be located at a remote location and connected to the other elements over a network. Further, the invention may be implemented on a distributed system having a plurality of nodes, where each portion of the invention (e.g., canvas, edgelist generator, etc.) may be located on a different node within the distributed system. In one embodiment of the invention, the node corresponds to a computer system. Alternatively, the node may correspond to a processor with associated physical memory. The node may alternatively correspond to a processor with shared memory and/or resources. Further, software instructions to perform embodiments of the invention may be stored on a computer readable medium such as a compact disc (CD), a diskette, a tape, a fixed or portable hard drive, or any other tangible computer readable storage device.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer implemented method for connecting a programmable device (PD) and an electronic component (EC) based on a protocol, comprising:
   using the computer for:
   obtaining a signal group of the protocol comprising a group constraint, a first pin definition including an electrical constraint and a logical constraint, and a second pin definition;
   mapping the first pin definition to a first pin of the PD based on the electrical constraint, the logical constraint, and the group constraint, wherein the first pin of the PD is programmable to operate in accordance with the logical constraint and the electrical constraint;
   identifying a first pin of the EC to connect with the first pin of the PD based on the electrical constraint, the logical constraint, the group constraint, and a connection preference;
   generating a first connection between the first pin of the EC and a second pin of the PD based on the electrical constraint, the logical constraint, the group constraint, and the connection preference, wherein the second pin of the PD is programmable to operate in accordance with the logical constraint and the electrical constraint; and
   storing the first connection in an edge list.

2. The method of claim 1, wherein the EC is a socket on a backplane and the PD is located on a printed circuit board for connection with the backplane.

3. The method of claim 1, further comprising:
   initializing a first edge weight matrix (EWM) comprising a first dimension and a second dimension, wherein the first dimension of the first EWM includes a representation of the first pin of the PD, and wherein the second dimension of the first EWM includes a representation of the first pin definition and a representation of the second pin definition;
   identifying, from the first EWM and before mapping the first pin definition, a first pin group of the PD based on a size of the signal group, wherein the first pin group of the PD comprises the first pin of the PD and a third pin of the PD programmable to operate in accordance with the second pin definition;
   mapping the second pin definition to the third pin of the PD; and
   setting a plurality of entries in the first EWM associated with the representation of the first pin definition to an exclusion value.

4. The method of claim 3, wherein the PD is a field programmable gate array (FPGA), wherein the first pin group of the PD is a bank of the FPGA, and wherein the group constraint requires the first pin definition and the second pin definition be mapped to pins of the same bank.

5. The method of claim 3, further comprising:
   populating a pin group locking array (PGLA) with a plurality of connection preference weights, wherein a first dimension of the PGLA includes a representation of the first pin group of the PD, and wherein a second dimension of the PGLA includes a plurality of representations for the plurality of pin groups in the EC; and
   selecting, before identifying the first pin of the EC, a pin group of the EC based on a connection preference weight associated with the first pin group of the PD and the pin group of the EC, wherein the pin group of the EC comprises the first pin of the EC.

6. The method of claim 5, further comprising:
   initializing a second EWM, wherein a first dimension of the second EWM includes a plurality of representations for a plurality of pins of the PD, and wherein a second dimension of the second EWM includes a plurality of representations for a plurality of pins of the EC;
   adding, before identifying the first pin of the EC, the connection preference weight to a plurality of edges in the second EWM associated with both the first pin group of the PD and the pin group of the EC; and
   identifying, from the second EWM, a second pin of the EC to connect with the third pin of the PD based on an edge of the plurality of edges, wherein the pin group of the EC further comprises the second pin of the EC.

7. The method of claim 5, wherein the connection preference is nearest fit preference, and wherein the connection preference weight comprises an average Manhattan distance between the first pin group of the PD and the pin group of the EC.

8. The method of claim 5, wherein the connection preference is a smallest fit preference, and wherein the connection preference weight comprises an absolute difference between a number of pins in the pin group of the EC and a number of pins in the first pin group of the PD.

9. The method of claim 5, further comprising:
   selecting, before generating the first connection, a second pin group of the PD using the PGLA, wherein the second pin group of the PD comprises the second pin of the EC; and
   generating a second connection between a second pin of the EC and a fourth pin of the PD, wherein the second pin group of the PD further comprises the fourth pin of the PD, and wherein the second pin of the EC is identified for connection with the third pin of the PD.

10. The method of claim 1, further comprising:
    optimizing the first connection based on at least a pin breakout of the PD on a printed circuit (PC) board to reduce a number of layers on the PC board for connecting the PD and the EC.

11. A computer readable storage device storing instructions, executable by a computer, for connecting a first programmable device (PD) and an electronic component (EC) based on a protocol, the instructions comprising functionality to:
    obtain a signal group of the protocol comprising a group constraint, a first pin definition including an electrical constraint and a logical constraint, and a second pin definition;
    map the first pin definition to a first pin of the PD based on the electrical constraint, the logical constraint, and the group constraint, wherein the first pin of the PD is programmable to operate in accordance with the logical constraint and the electrical constraint;
    identify a first pin of the EC to connect with the first pin of the PD based on the electrical constraint, the logical constraint, the group constraint, and a connection preference;
    generate a first connection between the first pin of the EC and a second pin of the PD based on the electrical constraint, the logical constraint, the group constraint, and the connection preference, wherein the second pin of the PD is programmable to operate in accordance with the logical constraint and the electrical constraint; and store the first connection in an edge list.

12. The computer readable storage device of claim 11, the instructions, executable by a computer, further comprising functionality to:

initialize a first edge weight matrix (EWM) comprising a first dimension and a second dimension, wherein the first dimension of the first EWM includes a representation of the first pin of the PD, and wherein the second dimension of the first EWM includes a representation of the first pin definition and a representation of the second pin definition;

identify, from the first EWM and before mapping the first pin definition, a first pin group of the PD based on a size of the signal group, wherein the first pin group of the PD comprises the first pin of the PD and a third pin of the PD programmable to operate in accordance with the second pin definition;

map the second pin definition to the third pin of the PD; and set a plurality of entries in the first EWM associated with the representation of the first pin definition to an exclusion value.

13. The computer readable storage device of claim 12, the instructions, executable by a computer, further comprising functionality to:

populate a pin group locking array (PGLA) with a plurality of connection preference weights, wherein a first dimension of the PGLA includes a representation of the first pin group of the PD, and wherein a second dimension of the PGLA includes a plurality of representations for the plurality of pin groups in the EC; and select, before identifying the first pin of the EC, a pin group of the EC based on a connection preference weight associated with the first pin group of the PD and the pin group of the EC, wherein the pin group of the EC comprises the first pin of the EC.

14. The computer readable storage device of claim 13, the instructions, executable by a computer, further comprising functionality to:

initialize a second EWM, wherein a first dimension of the second EWM includes a plurality of representations for a plurality of pins of the PD, and wherein a second dimension of the second EWM includes a plurality of representations for a plurality of pins of the EC;

add, before identifying the first pin of the EC, the connection preference weight to a plurality of edges in the second EWM associated with both the first pin group of the PD and the pin group of the EC; and identify, from the second EWM, a second pin of the EC to connect with the third pin of the PD based on an edge of the plurality of edges, wherein the pin group of the EC further comprises the second pin of the EC.

15. A system for connecting a first programmable device (PD) and a EC based on a protocol, comprising:

a component repository storing a component file describing the PD;

a protocol synthesizer comprising an edge weight matrix (EWM) for mapping a signal group of the protocol to a first pin group of the PD using the component file, wherein the signal group comprises a group constraint, a pin definition including an electrical constraint and a logical constraint;

a canvas for settings positions of the PD and the EC; and an edgelist generator comprising a pin group locking matrix for identifying a pin group of the EC to connect with the first pin group of the PD after mapping the signal group and setting positions, wherein the edgelist generator is further configured to generate a plurality of connections between the pin group of the EC and a second pin group of the PD based on the group constraint, the electrical constraint, the logical constraint, and a connection preference.

16. The system of claim 15, wherein the connection preference is a length matching preference, and wherein the PGLA comprises an absolute difference between a longest connection and a shortest connection between the second pin group of the PD and the pin group of the EC.

17. The system of claim 15, wherein the PD is a field programmable gate array (FPGA) and the first pin group of the PD is a bank of the FPGA.

18. The system of claim 15, wherein a first dimension of the PGLA includes a representation of the first pin group of the PD, and wherein a second dimension of the PGLA includes a representation of the pin group of the EC.

19. The system of claim 15, wherein a first dimension of the EWM includes a plurality of representations for the plurality of pins of the PD, and wherein a second dimension of the EWM includes a representation of the pin definition.

20. The system of claim 15, wherein the EC is a socket on a backplane and the PD is located on a circuit board for connection with the backplane.

* * * * *